United States Patent
Loopstra et al.

(10) Patent No.: US 9,986,628 B2
(45) Date of Patent: May 29, 2018

(54) METHOD AND APPARATUS FOR GENERATING RADIATION

(71) Applicant: ASML Netherlands B.V., Veldhoven (NL)

(72) Inventors: Erik Roelof Loopstra, Eindhoven (NL); Andrei Mikhailovich Yakunin, Mierlo (NL); Vadim Yevgenyevich Banine, Deurne (NL); Andrey Nikipelov, Eindhoven (NL); Edgar Alberto Osorio Oliveros, Eindhoven (NL); Alexander Matthijs Struycken, Eindhoven (NL); Bert Pieter Van Drieënhuizen, Veldhoven (NL); Jan Bernard Plechelmus Van Schoot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 14/440,934

(22) PCT Filed: Oct. 10, 2013

(86) PCT No.: PCT/EP2013/071141
§ 371 (c)(1),
(2) Date: May 6, 2015

(87) PCT Pub. No.: WO2014/072149
PCT Pub. Date: May 15, 2014

(65) Prior Publication Data
US 2015/0296602 A1    Oct. 15, 2015

Related U.S. Application Data

(60) Provisional application No. 61/723,541, filed on Nov. 7, 2012, provisional application No. 61/723,955, filed on Nov. 8, 2012.

(51) Int. Cl.
*H05G 2/00* (2006.01)
*G03F 7/20* (2006.01)
(Continued)

(52) U.S. Cl.
CPC ......... *H05G 2/006* (2013.01); *G03F 7/70033* (2013.01); *G03F 7/7085* (2013.01);
(Continued)

(58) Field of Classification Search
USPC ....................................... 250/493.1
See application file for complete search history.

(56) References Cited

U.S. PATENT DOCUMENTS 5,790,574 A    8/1998    Rieger et al.
6,002,744 A *  12/1999   Hertz ............... H05G 2/003
                                              378/119

(Continued)

FOREIGN PATENT DOCUMENTS

JP    2006-135298 A    5/2006
JP    2006-332552 A    12/2006
(Continued)

OTHER PUBLICATIONS

International Search Report directed to related International Patent Application No. PCT/EP2013/071141, dated Sep. 16, 2014; 7 pages.

(Continued)

*Primary Examiner* — Phillip A Johnston
(74) *Attorney, Agent, or Firm* — Sterne, Kessler, Goldstein & Fox P.L.L.C.

(57) ABSTRACT

A method of generating radiation for a lithography apparatus. The method comprises providing a continuously renewing fuel target (50) at a plasma formation location (12) and directing a continuous-wave excitation beam (6) at the plasma formation location such that fuel within the continu- (Continued)

ously renewing fuel target is excited by the continuous-wave excitation beam to a radiation generating plasma.

15 Claims, 13 Drawing Sheets

(51) Int. Cl.
*H01S 3/08* (2006.01)
*G21K 1/06* (2006.01)
*H01S 3/23* (2006.01)
*H01S 3/07* (2006.01)
*H01S 3/081* (2006.01)
*H01S 3/13* (2006.01)
*H01S 3/223* (2006.01)

(52) U.S. Cl.
CPC .......... *G21K 1/062* (2013.01); *H01S 3/08059* (2013.01); *H05G 2/008* (2013.01); *G21K 2201/067* (2013.01); *H01S 3/073* (2013.01); *H01S 3/0815* (2013.01); *H01S 3/1307* (2013.01); *H01S 3/2232* (2013.01); *H01S 3/2383* (2013.01)

(56) References Cited

U.S. PATENT DOCUMENTS

| | | | |
|---|---|---|---|
| 6,307,913 B1 | 10/2001 | Foster et al. | |
| 7,705,331 B1* | 4/2010 | Kirk | G01N 21/956 250/306 |
| 7,880,153 B2 | 2/2011 | Suganuma et al. | |
| 7,907,646 B2* | 3/2011 | Mizuuchi | H01S 3/0627 372/21 |
| 8,107,167 B2* | 1/2012 | Galvanauskas | G02B 27/1006 359/333 |
| 8,345,717 B2* | 1/2013 | Dekker | H01S 3/1086 372/20 |
| 2006/0078017 A1 | 4/2006 | Endo et al. | |
| 2006/0233309 A1 | 10/2006 | Kutzner et al. | |
| 2006/0249699 A1* | 11/2006 | Bowering | B82Y 10/00 250/504 R |
| 2007/0002925 A1* | 1/2007 | Zediker | H01S 5/4025 372/98 |
| 2008/0197299 A1 | 8/2008 | Hoshino et al. | |
| 2008/0296799 A1* | 12/2008 | Faubel | H05G 2/003 264/166 |
| 2010/0090133 A1 | 4/2010 | Endo et al. | |
| 2011/0280581 A1 | 11/2011 | Chann et al. | |
| 2011/0292498 A1 | 12/2011 | Chann et al. | |
| 2011/0305250 A1 | 12/2011 | Chann et al. | |
| 2012/0145930 A1 | 6/2012 | Kuwabara et al. | |
| 2015/0286145 A1* | 10/2015 | Nikipelov | H05G 2/008 250/504 R |

FOREIGN PATENT DOCUMENTS

| | | |
|---|---|---|
| JP | 2007-103176 A | 4/2007 |
| JP | 2008-218600 A | 9/2008 |
| JP | 2011-054403 A | 3/2011 |
| JP | 2012-004311 A | 1/2012 |
| WO | WO 2014/063878 A2 | 5/2014 |

OTHER PUBLICATIONS

International Preliminary Report on Patentability and Written Opinion of the International Searching Authority directed to related International Patent Application No. PCT/EP2013/071141, dated May 12, 2015; 11 pages.

* cited by examiner

METHOD AND APPARATUS FOR GENERATING RADIATION

CROSS-REFERENCE TO RELATED APPLICATIONS

This application claims the benefit of U.S. provisional application 61/723,541 and 61/723,955 which were filed on 7 Nov. 2012 and on 8 Nov. 2012 respectively, and which is incorporated herein in its entirety by reference.

FIELD OF THE INVENTION

The present invention relates to a method and apparatus for generating radiation.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation source for producing EUV radiation may include an excitation beam, such as a laser, for exciting a fuel to provide the plasma, and an enclosure for containing the plasma. The plasma may be created, for example, by directing a laser beam (i.e., an excitation beam providing radiation for initiation of the plasma) at a fuel, such as droplets (i.e., droplets) of a suitable fuel material (e.g., tin, which is currently thought to be the most promising and thus likely choice of fuel for EUV radiation sources), or at a stream of a suitable gas or vapor, such as Xe gas or Li vapor. The resulting plasma emits output radiation, e.g., EUV radiation, which is collected using a radiation collector. The radiation collector may be a mirrored normal incidence radiation collector (sometimes referred to as a near normal incidence radiation collector), which receives the radiation from the plasma and focuses the radiation into a beam. The radiation source may include an enclosure or chamber arranged to provide a vacuum environment to support the plasma, and typically the radiation collector will be located within the enclosure. Such a radiation system is typically termed a laser produced plasma (LPP) source, when a laser is used to provide the beam of excitation radiation. In an alternative system, which may also employ the use of a laser, radiation may be generated by a plasma formed by the use of an electrical discharge—a discharge produced plasma (DPP) source.

The present application is concerned with radiation sources, and methods of generation of radiation, particularly EUV radiation for use in lithography, where the radiation, is produced from a plasma generated by excitation of a fuel by means of an excitation beam, which may typically be a laser beam, such as an infra-red laser beam. Such radiation sources include LPP radiation sources and for the sake of brevity, such a source is referred to hereinafter as an LPP radiation source, although it will be understood that the excitation beam is not necessarily limited to being a laser beam, and any other suitable excitation beam (or combination of excitation beams) may be employed. From a plasma, the radiation is typically generated at a first focal point of a radiation collector, and focused by the radiation collector to form an image at a second focal point. The second focal point is often referred to as the intermediate focus.

It is desirable to obviate or mitigate at least one problem of the prior art, whether identified herein or elsewhere, or to provide an alternative to existing apparatus or methods. In particular it is one object of the invention, amongst others, to provide methods and apparatus for generation of radiation, such as EUV radiation, from a fuel excited to a plasma by an excitation beam, with a high power.

BRIEF SUMMARY OF THE INVENTION

The nature of LPP sources is such that it is generally desirable to reduce the amount of fuel that is present and circulating within the LPP source during plasma generation in order to control the amount of debris that is generated. Debris is generated during plasma generation and may comprise ions and fast moving particulate matter. For example, normal incidence collectors of the type used in LPP sources are particularly susceptible to damage caused by debris, although other components used within the LPP source are also susceptible to damage caused by debris.

It has additionally been desirable to increase intensity of the excitation beam directed at the fuel plasma formation location without increasing the power used to generate the excitation beam. As such, the excitation beam is focused in both time and space. That is, the excitation beam is focused onto a relatively small area, and is emitted in pulses, rather than in a continuous-wave. For example, a typical excitation beam may provide pulses of 40-80 kHz, with pulse lengths of approximately 100 ns.

In addition to increasing the irradiation for a given power, the use of focused, pulsed excitation beams, enables the use of droplet fuel targets. Use of fuel droplets allows tight control over the amount of fuel that is used within the radiation source. By using a smaller quantity of fuel, the amount of debris generated during plasma creation may be controlled and/or reduced. The synchronized combination of pulsed radiation and droplet fuel targets therefore synergistically solves a number of problems within the LPP source. As such, it is generally accepted that pulsed excitation beams and droplet fuel targets should be utilized in LPP radiation sources.

In known LPP radiation sources, a stream of fuel droplets is arranged to travel in a trajectory passing through or near a focal point of the excitation beam pulse. As the droplets cross the path of the excitation beam pulse near the focal point, the fuel droplets are heated up to an extremely high temperature by the focused excitation beam pulse and a plasma is formed of high energy ions of the fuel material, and electrons. In the plasma the atoms of the fuel material are stripped of their outer electrons. As the electrons return to the ions, photons of EUV radiation are emitted. The point at which the excitation beam pulse is incident on the fuel may be referred to as the plasma formation location.

In a typical arrangement, the fuel droplets may be roughly spherical molten droplets (e.g., of tin), with a diameter about 30 μm, with the waist of the focused excitation source (usually an infra-red laser beam) being 60 to 450 μm in diameter at its focal point. Droplets are typically generated at frequencies between 40 to 80 kHz and directed towards the focused region of the pulsed excitation beam with velocities typically from 40 to 120 m/s.

In order to increase the output power of the radiation source, a number of approaches have been explored:

The conversion efficiency may be increased by shaping the fuel droplets into a pancake shape by using a laser pre-pulse. However, it is desirable to be able to use the shiny surface of molten fuel droplets in an arrangement where the presence of the fuel particle triggers the excitation beam to pulse. This arrangement may be referred to as a NoMo arrangement (No Master oscillator). Pancaked droplets are less suitable for use as a trigger, in such a NoMo arrangement, than are spherical droplets. Also, additional metrology would be necessary for a pancake arrangement in order to maintain the droplet stream trajectory passing through, or near, a first focal point of a radiation collector and to measure the position of the fuel droplets, in order to trigger both the pre-pulse laser and the main excitation beam.

Radiation output may also be increased by increasing the fuel droplet size. However, larger fuel droplets may not necessarily be entirely heated or excited to the adequate ionization temperature to lead to complete vaporization and plasma generation, and this may lead to additional debris droplets being formed to contaminate the interior of the radiation source and the radiation collector optics.

Radiation output may also be increased by increasing the energy per pulse of excitation radiation. An increase in energy leads, however, to increased irradiation of the fuel droplet, and therefore, to overheating of the plasma. This, in turn, leads to a reduction in the conversion efficiency. To avoid overheating, the size of the fuel droplet may be increased. If the fuel droplet is increased too much, this may result in the disadvantages of incomplete vaporization described above. Additionally, increases in the size of the fuel droplet results in an increase in the plasma size, and a corresponding increase in the etendue causing an undesirable increase in the image size at the intermediate focus of the radiation collector. If the image size is too large, the image may no longer be suitable for use in the remaining stages of the lithography apparatus.

Radiation output may also potentially be increased by increasing both the fuel particle velocity and fuel particle frequency in the fuel stream in order to increase the total fuel consumption rate whilst maintaining the separation distance between the droplets, at the excitation beam focal point, sufficiently large to avoid the generated plasma deviating subsequent fuel droplets from their path. However, the pressure needed to maintain the flow though a nozzle is proportional to the square of the velocity through the nozzle, so doubling the fuel stream velocity would require a quadrupling of pressure. Such high pressures may lead to shortened lifetime or failure of the fuel stream generation apparatus.

A higher jet velocity also results in an increase in the length of the region over which the coalescence takes place increasing and this may result in greater numbers of un-coalesced satellite droplets in the stream, causing inhomogeneity in the generated radiation beam.

Fuel droplets, which are by their nature free in space, are particularly susceptible to interactions with plasma and debris created from prior fuel droplets. Such interactions may lead to variation in fuel droplet timing. Further, plasma generated by respective laser pulses and respective fuel droplets may vary in unpredictable ways, leading to unpredictable variation in fuel droplet timing. Variation in the timing of fuel droplets may lead to difficulty in accurately timing respective laser pulses. In order to improve the accuracy with which respective excitation beam pulses hit respective droplets, complex droplet and pulse timing mechanisms have been proposed.

While the above approaches have resulted in increased power output by LPP radiation sources, it is desired to provide methods and apparatus for generation of radiation, such as EUV radiation, with yet higher power, but with a reduction in the problems previously associated with such increased power generation, for instance as compared to prior art means of increasing the generated radiation power.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Whenever appropriate, the use of the term "comprises" or "comprising" may also be taken to include the meaning "consists essentially of" or "consisting essentially of" and may also be taken to include the meaning of "consists of" or "consisting of."

Optional and/or preferred features as set out herein may be used either individually, or in combination with each other, where appropriate, and particularly in the combinations as set out in the accompanying claims. The optional and/or preferred features for each aspect of the invention set out herein are also applicable to any other aspects of the invention, where appropriate.

According to a first aspect of the present invention there is provided a method of generating radiation for a lithography apparatus, the method comprising: providing a continuously renewing fuel target at a plasma formation location; directing a continuous-wave excitation beam at the plasma formation location such that fuel within the continuously renewing fuel target is excited by the continuous-wave excitation beam to generate a radiation generating plasma.

By providing both a continuous-wave excitation beam and a continuously renewing fuel target in combination, it has been realized that many of the problems encountered in the prior art may be overcome. For example, problems encountered when attempting to increase generated radiation intensity in droplet fuel target and pulsed excitation beam radiation generators may be overcome. Additionally, it has been unexpectedly discovered that problems that have long been believed to require droplet fuel targets and pulsed excitation beams are obviated and/or mitigated when both a continuous-wave excitation beam and a continuously renewing fuel target are provided in combination.

Providing a continuously renewing fuel target may comprise directing a jet from a first location to a second location, the jet being continuous between the first and second locations, the jet comprising a fuel for use in generating the radiation generating plasma, and the jet at least partially intersecting the plasma formation location.

The continuously renewing fuel target may be provided by a rotating body arranged to transport fuel from a fuel reservoir to the plasma formation location.

The rotating body may be a rotating disk.

The fuel reservoir may be a bath of liquid fuel. The rotating body may rotate through the bath of liquid fuel and the plasma formation location such that the rotating body receives a coating of liquid fuel and transports the coating of liquid fuel to the plasma formation location.

The continuous excitation beam may be a continuous-wave laser beam provided by a continuous-wave laser.

The continuous-wave laser may be arranged to generate the continuous-wave laser beam within an optical resonator comprising a first reflector and a second reflector.

The second reflector may be provided by a surface of the continuously renewing fuel target at the plasma formation location. The surface of the continuously renewing fuel target may be a substantially planar and/or substantially reflective surface.

The continuous-wave laser may be a gas laser comprising at least one amplification chamber. If the gas laser comprises a plurality of amplification chambers, each of the amplification chambers may be maintained at substantially the same pressure. This is particularly advantageous over pulsed lasers of the prior art, which comprise a plurality of amplification chambers, as each amplification chamber is required to be maintained at a different pressure.

Radiation generated from the radiation generating plasma may be collected by a radiation collector in the form of a grazing incidence collector or a normal incidence collector.

Debris generated from the radiation generating plasma may be mitigated by a rotating foil trap. More generally, the radiation source may comprise a debris mitigation device in the form of one or more contaminant traps in order to reduce propagation of debris within the radiation source, and/or to other parts of the lithography apparatus. Such contaminant traps may comprise one or more of a rotating foil trap, a static foil trap or a gas barrier.

According to a second aspect of the present invention, there is provided a lithographic method, comprising: generating radiation according to the method of any preceding claims; and using the generated radiation to apply a pattern to a substrate.

According to a third aspect of the present invention, there is provided a radiation source comprising: a fuel target generator arranged to provide a continuously renewing fuel target at the plasma formation location; an excitation beam source arranged to direct a continuous-wave excitation beam to the plasma formation location such that, in use, fuel within the continuously renewing fuel target is excited by the continuous-wave excitation beam to generate a radiation generating plasma.

The fuel target generator may comprise a nozzle for directing a jet from a first location to a second location, the jet being continuous between the first and second locations and comprising fuel for use in generating the radiation generating plasma. The continuously renewing fuel target may be a part of the jet at the plasma formation location.

The fuel target generator may comprise a body arranged to rotate to transport fuel from a fuel reservoir to the plasma formation location.

The body may be a disk.

The fuel reservoir may comprise a bath of liquid fuel, and the body may be arranged to rotate through the bath of liquid fuel and the plasma formation location such that the body receives a coating of liquid fuel and transports the coating of liquid fuel to the plasma formation location.

The excitation beam source may comprise a continuous-wave laser arranged to provide the continuous excitation beam in the form of a continuous-wave laser beam.

The continuous-wave laser may be arranged to generate the continuous-wave laser beam within an optical resonator comprising a first reflector and a second reflector.

The continuous-wave laser may comprise the first reflector and may be arranged to use a surface of the continuously-renewing fuel target at the plasma formation location as the second reflector. For example, if the continuous-wave laser is considered as an isolated component of the radiation source, the continuous-wave laser may comprise a single reflector for use in creating an optical resonator. The fuel may be a molten metal such as molten tin. Molten tin provides a fuel source which is highly efficient for generation of EUV radiation and provides a reflective surface to allow the continuously renewing fuel target act as the second reflector.

The radiation source may further comprise a radiation collector for collecting radiation generated by the radiation generating plasma. The radiation collector may, for example, be a grazing incidence collector or a normal incidence collector. The radiation collector may take any other appropriate form.

The radiation source may further comprise debris mitigation means. For example, the debris mitigation means may comprise a rotating foil trap. The debris mitigation means additionally or alternatively comprise other components such as a static foil trap, or a gas barrier.

According to a fourth aspect of the present invention, there is provided a lithographic apparatus comprising, or in connection with, the radiation source of the third aspect.

The lithographic apparatus may further comprise an illumination system configured to condition the radiation generated by the radiation generating plasma to form a conditioned radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

According to a fifth aspect of the present invention, there is provided a device manufacturing method comprising generating radiation using the method of the first aspect and using the lithographic apparatus of the fourth aspect to pattern a substrate. The radiation is preferable EUV radiation.

By continuously renewing fuel target it is to be understood that the fuel is not provided to the plasma formation location in discrete packets. For example, the fuel is not provided in droplets, or discrete particles. For example, the continuously renewing fuel target is such that for the duration of operation of the continuous excitation beam, fuel is renewed at the plasma formation location without breaks. It will be appreciated that whilst the continuous excitation beam is not operational (for instance during cleaning or maintenance of the radiation source), the continuously renewing fuel target may also be stopped. In some embodiments of the present invention, the continuously renewing fuel target may continue to be provided when the continuous excitation beam is stopped, for example where the fuel is molten metal such as molten tin, in order to prevent solidification of the fuel.

According to a sixth aspect of the invention, there is provided an apparatus comprising an excitation beam source arranged to direct a plurality of excitation beams at a target location to form a first merged excitation beam at the target location; wherein said excitation beam source comprises at least one phase adjuster for adjusting a phase of at least one of said plurality of excitation beams with respect to at least one other of said plurality of excitation beams.

This has the advantage that qualities of the first merged excitation beam may be controlled through control of the phase adjuster.

The apparatus may be a radiation source.

The plurality of excitation beams may comprise a plurality of laser beams having the same wavelength.

The excitation beam source may comprise a first sensor arrangement configured to measure a first property, said first property being a property of a first portion of radiation, said first property being indicative of a second property, said second property being a property of said first merged excitation beam. The first property may be at least partially determined by a phase of at least one of said plurality of excitation beams with respect to at least one other of said plurality of excitation beams. In this way, the phase of the at least one excitation beam may be adjusted more accurately based on feedback provided by the first sensor arrangement.

The first sensor arrangement may comprise a first optical element arranged to direct respective portions of at least two of said plurality of excitation beams to form a second merged excitation beam. The first portion of radiation may be said second merged excitation beam. The first property may be indicative of at least one of an intensity of said first merged excitation beam, a position of said first merged excitation beam, a focal point of said merged excitation beam, and an interference pattern of said merged excitation beam. This has the advantage that the first portion provides a proxy for the properties of the first merged excitation beam.

The apparatus may further comprise a controller wherein the first sensor arrangement provides a first sensor signal to the controller; and wherein the controller is configured to control said at least one phase adjuster based at least in part on said first sensor signal.

The apparatus may further comprise a second sensor arrangement configured to measure a second property, said second property being a property of at least one second portion of radiation, said second property being indicative of a third property, said third property being a property of at least one of said plurality of excitation beams. The provision of a second sensor can provide for more accurate control of the phase adjuster.

The second sensor arrangement may be configured to measure a second property for each one of said plurality of excitation beams. In this way, the second sensor, and therefore control of a phase of the excitation beams, may be made more accurate.

The third property may be a phase of said at least one of said plurality of excitation beams.

The apparatus may further comprise a second controller; wherein the second sensor arrangement provides a second sensor signal to the second controller; and wherein the second controller is configured to control said at least one phase adjuster based at least in part on said second sensor signal. The second controller may be provided by the first controller.

The first sensor arrangement and/or second sensor arrangement may comprise at least one of a photodiode, a split photodiode, a charge coupled device array and an active pixel sensor.

The at least one phase adjuster may comprise a respective phase adjuster for each of said plurality of excitation beams.

The excitation beam source may comprise at least one focusing element configured to direct said plurality of excitation beams to said plasma formation location. The at least one phase adjuster may comprise means for varying a path length between a source of at least one of said plurality of excitation beams and said at least one focusing element.

The apparatus may further comprise: a fuel target generator arranged to provide a fuel target at said target location, such that, in use, fuel within the fuel target is excited by the first merged excitation beam to generate a radiation generating plasma. In this way, the advantageous apparatus of the above aspect may be used to provide a radiation source (such as an EUV radiation source) which may be used within a lithographic apparatus.

According to a seventh aspect, there is provided a lithographic apparatus comprising, or in connection with one or more of the above aspects.

The lithographic apparatus may comprise an illumination system configured to condition the radiation generated by the radiation generating plasma to form a conditioned radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

According to an eighth aspect of the invention, there is provided a method of generating radiation for a lithography apparatus, comprising: providing a fuel target at a plasma formation location; directing a plurality of excitation beams at a plasma formation location to form a first merged excitation beam at the plasma formation location such that fuel within the fuel target is excited by the first merged excitation beam to generate a radiation generating plasma;

adjusting a phase of at least one of said plurality of excitation beams with respect to at least one other of said plurality of excitation beams.

Adjusting a phase of at least one of said plurality of excitation beams may comprise adjusting a phase of at least one of said plurality of excitation beams such that each of said plurality of excitation beams is coherently merged in said first merged excitation beam.

The method may further comprise measuring at a first sensor arrangement a first property, said first property being a property of a first portion of radiation, said first property being indicative of a second property, said second property being a property of said first merged excitation beam; wherein said first property is at least partially determined by a phase of at least one of said plurality of excitation beams with respect to at least one other of said plurality of excitation beams.

The method may further comprise directing respective portions of at least two of said plurality of excitation beams to form a second merged excitation beam, wherein said first portion of radiation is said second merged excitation beam.

The first property may be indicative of at least one of an intensity of said first merged excitation beam, a position of said first merged excitation beam, a focal point of said first merged excitation beam, and an interference pattern of said merged excitation beam.

The method may further comprise receiving a first sensor signal from the first sensor arrangement and adjusting said at least one phase adjuster based on said first sensor signal.

The method may further comprise measuring at a second sensor arrangement a third property, said third property being a property of at least one second portion of radiation, said third property being indicative of a fourth property, said fourth property being a property of at least one of said plurality of excitation beams.

Measuring at a second sensor arrangement may comprise measuring a third property of a respective second portion of radiation for each one of said plurality of excitation beams.

The third property may be indicative of a phase of said at least one of said plurality of excitation beams.

Adjusting a phase of at least one of said plurality of excitation beams with respect to at least one other of said plurality of excitation may comprise adjusting a phase of a respective phase adjuster for each of said plurality of excitation beams.

Adjusting a phase of at least one of said plurality of excitation beams with respect to at least one other of said plurality of excitation beams may comprise varying a path length between a source of at least one of said plurality of excitation beams and at least one focusing element arranged to direct said plurality of excitation beams to said plasma formation location.

According to a ninth aspect of the invention, there is provided a lithographic method, comprising generating radiation according to any of the method aspects described above and using the generated radiation to apply a pattern to a substrate.

One or more aspects of the invention may, where appropriate to one skilled in the art, be combined with any one or more other aspects described herein, and/or with any one or more features described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
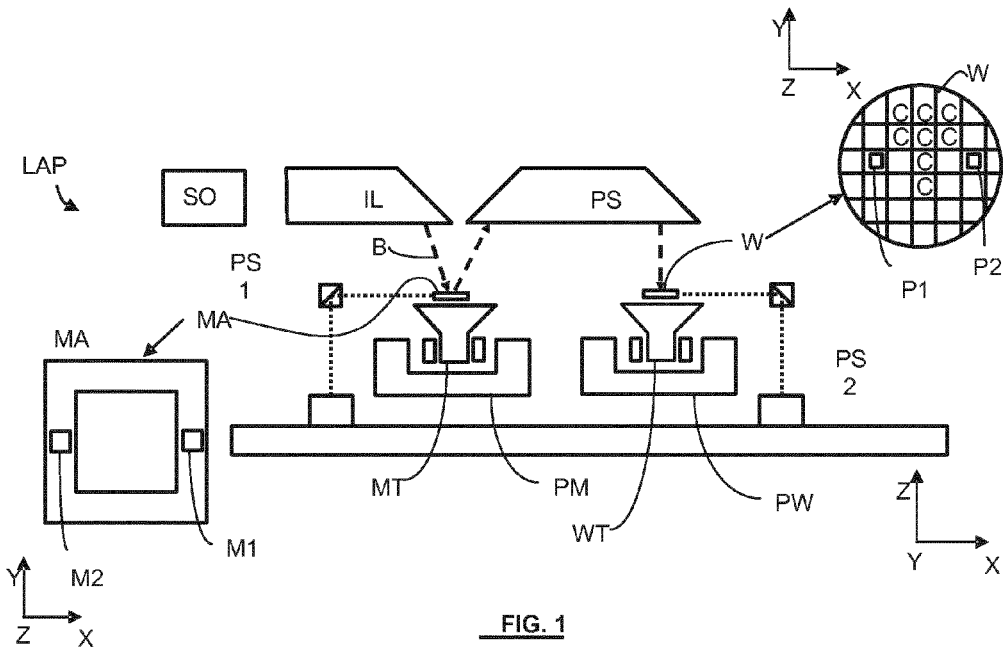
FIG. 1 is a schematic illustration of a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION OF THE INVENTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LAP including radiation source SO according to an embodiment of the invention. The apparatus comprises: an illumination system (illuminator) IL arranged to condition a radiation beam B (e.g., EUV radiation); a support structure (e.g., a mask table) MT constructed to support a patterning device (e.g., a mask or a reticle) MA and connected to a first positioner PM arranged to accurately position the patterning device; a substrate table (e.g., a wafer table) WT constructed to hold a substrate (e.g., a resist-coated wafer) W and connected to a second positioner PW arranged to accurately position the substrate; and a projection system (e.g., a reflective projection system) PS arranged to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the radiation source SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream, cluster or jet of material having the required line-emitting element, with a laser beam.

The radiation source SO may be part of an EUV radiation system including a fuel stream generator for generating a stream of fuel and/or a laser (neither of which are shown in FIG. 1), for providing the laser beam for exciting the fuel. The resulting plasma emits output radiation, e.g., EUV radiation, which is collected using a radiation collector, disposed in the radiation source. The laser and/or fuel stream generator and the collector module (often referred to as radiation source), may be separate entities, for example when a $CO_2$ laser is used to provide the laser beam for fuel excitation.

In such cases, the laser is not considered to form part of the lithographic apparatus and the radiation beam is passed from the laser to the radiation source with the aid of a beam delivery system comprising, for example, suitable directing mirrors and/or a beam expander. In other cases the source may be an integral part of the radiation source, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
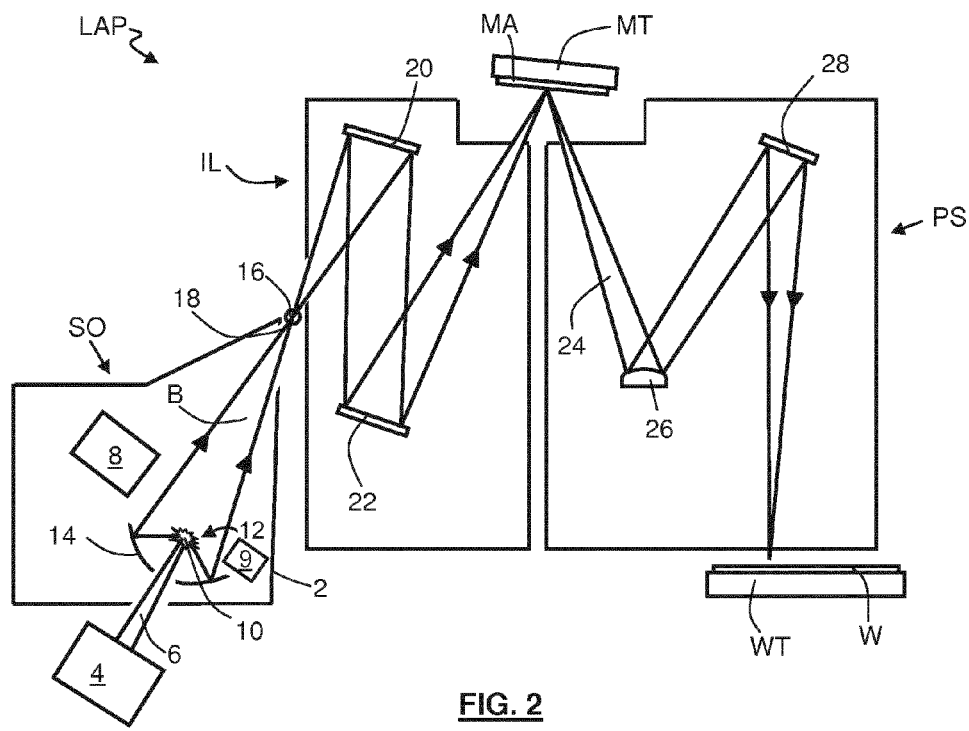
FIG. 2 is a more detailed schematic illustration of the apparatus of FIG. 1 according to an embodiment of the present invention, including an LPP radiation source comprising a normal incidence radiation collector.

FIG. 2 shows the lithographic apparatus LAP in more detail according to an aspect of the present invention, including the radiation source SO, the illumination system IL, and the projection system PS. The radiation source SO is constructed and arranged such that a vacuum environment can be maintained in an enclosing structure 2 of the radiation source.

A laser 4 is arranged to deposit laser energy via a laser beam 6 into a fuel, such as tin (Sn) or lithium (Li) which is provided from a fuel stream generator in the form of a fuel jet generator 8. Liquid (i.e., molten) tin, or another metal in liquid form, is currently thought to be the most promising and thus likely choice of fuel for EUV radiation sources. A fuel jet trap 9 is arranged to receive fuel not spent during plasma creation. The deposition of laser energy into the fuel creates a highly ionized plasma 10 at a plasma formation location 12 which has electron temperatures of several tens of electronvolts (eV). The energetic radiation generated during de-excitation and recombination of these ions is emitted from the plasma 10, collected and focused by a near normal incidence radiation collector 14 (sometimes referred to more generally as a normal incidence radiation collector). The collector 14 may have a multilayer structure, for example one tuned to reflect, more readily reflect, or preferentially reflect, radiation of a specific wavelength (e.g., radiation of a specific EUV wavelength). The collector 14 may have an elliptical configuration, having two natural ellipse focus points. One focus point will be at the plasma formation location 10, and the other focus point will be at the intermediate focus, discussed below.

A laser 4 and/or radiation source and/or a collector 14 may together be considered to comprise a radiation source, specifically an EUV radiation source. The EUV radiation source may be referred to as a laser produced plasma (LPP) radiation source. The collector 14 in the enclosing structure 2 may form a part of the radiation source (in this example).

Although not shown, the fuel jet generator 8 will comprise, or be in connection with, a nozzle arranged to direct fuel, along a trajectory towards the plasma formation location 12.

Radiation B that is reflected by the radiation collector 14 is focused to form an image at a second focal point 16 of the radiation collector. The second focal point 16 is commonly referred to as the intermediate focus, and the radiation source SO is arranged such that the intermediate focus 16 is located at or near to an opening 18 in the enclosing structure 2. An image of the radiation emitting plasma 10 is formed at the intermediate focus 16.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

As described above, while numerous improvements have been made, and research continues, into the combination of pulsed lasers and droplet fuel targets, embodiments of the present invention are concerned with the use of continuous-wave lasers and a fuel target which is continuously renewing at the plasma formation location. As such, in embodiments of the present invention, the laser 4 of FIG. 2 is a continuous-wave laser, arranged such that the laser beam 6 is a continuous beam. That is, the laser 4 is not arranged to provide a pulsed laser beam. While this is an unexpected departure from the accepted use of pulsed lasers in a radiation source for EUV lithography machines, the present inventors have realised that use of a continuous-wave laser provides a number of advantages. Generally, in prior art pulsed lasers for use in an EUV radiation source for use with lithography apparatus, a "seed" laser beam is emitted into a first of plurality of amplifier chambers connected in series. Each of the amplifier chambers contains an optical gain medium through which the seed laser beam travels to sequentially increase, by a desired amount, the output power of the pulse of the laser beam. As the power of the laser beam increases at each stage, each amplifier chamber has different input and output requirements, and must therefore contain optical gain mediums comprising different gas mixtures maintained at different pressures.

Figure 3:
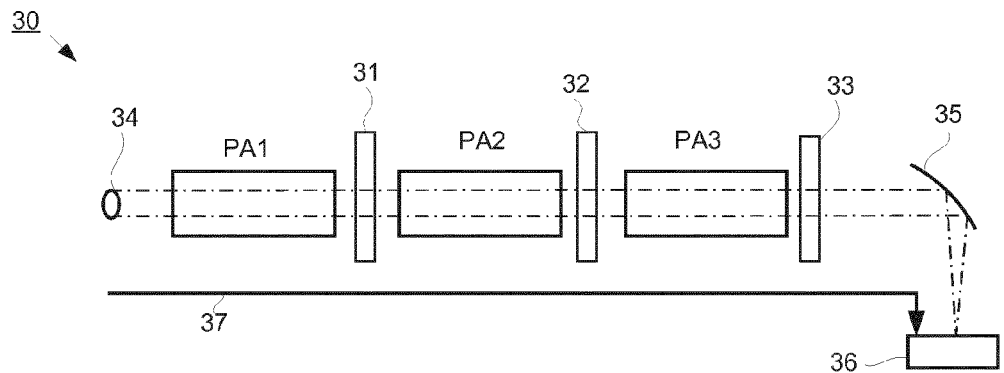
FIG. 3 is a schematic illustration of a pulsed laser used in prior art LPP radiation sources.

FIG. 3 schematically illustrates a prior art $CO_2$ laser 30 arranged to provide a pulsed laser beam. The laser 30 comprises three amplifier chambers PA1, PA2, PA3. As discussed above, each of the amplifier chambers PA1, PA2, PA3 comprises a different optical gain medium and is required to be maintained at a respective pressure. In order to maintain each amplifier chamber PA1, PA2, PA3 at its respective pressure, each amplifier chamber is separated from each other and the surroundings. In particular, the amplifier chambers PA1 and PA2 are separated by a window 31, while the amplifier chambers PA2 and PA3 are separated by a window 32. The amplifier chamber PA3 is separated from its surroundings (for example the radiation source SO) by a window 33.

In operation, a seed laser beam pulse 34 is provided into the amplifier chamber PA1, where it interacts with the optical gain medium within the amplifier chamber PA1, thereby increasing in power by stimulated emission. By controlling the optical gain medium within each of the chambers PA1, PA2, PA3, and the path of the laser beam pulse 34, the laser beam pulse 34 proceeds through the amplifier chambers PA1, PA2 and PA3, to exit through the window 33 at a desired power. The laser beam pulse 34 is directed by focusing optics 35 onto the fuel target 36. For a laser with a maximum power of 40 kW, each laser beam pulse is focused onto an area of approximately 300 μm to achieve a desired irradiance of approximately $2\times10^{10}$ W/cm$^2$. An arrow 37 in FIG. 3 illustrates the path taken by each discrete laser beam pulse through the laser 30 to the fuel target 36.

The high amounts of radiation within the laser 30 can result in deformation and deterioration of the windows 31, 32, 33. As such, the lifetime of the laser 30 may be reduced, while costs (as a result of the need to make repairs and as a result of "downtime" of the lithography machine while such repairs are undertaken) are increased. Additionally, because the pulsed laser 30 is arranged to direct the excitation pulses in a single direction, (i.e., the pulses propagate within the amplifier chambers in a single direction), back reflection (which may occur, for example, at the interface between the amplification chambers and the windows 31, 32, 33, or from the reflective surface of the fuel target 36) results in additional, unwanted behaviour with the optical gain medium, in a process that may be referred to as "gain stripping." This results in a reduction in the amount of the optical gain medium that is available for subsequent pulses.

Figure 4:
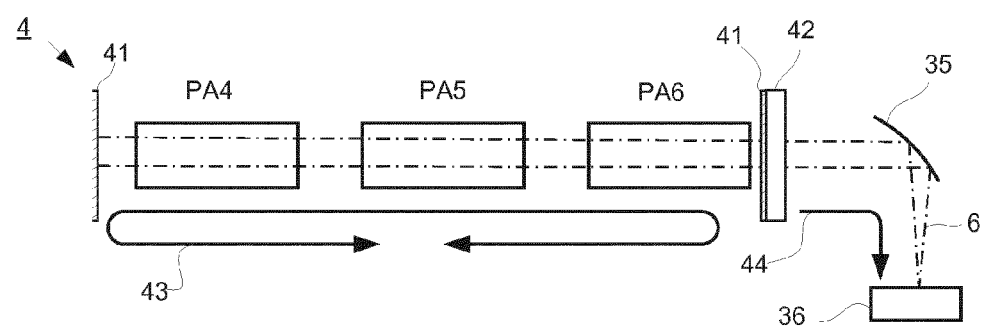
FIG. 4 is a schematic illustration of a continuous-wave laser for use in an LPP radiation source according to an embodiment of the present invention.

FIG. 4 schematically illustrates an example configuration of the laser 4 of FIG. 2 according to an embodiment of the present invention. In the configuration of FIG. 4, the laser 4 comprises CO2 laser comprising three amplifier chambers PA4, PA5, PA6 (although it will be appreciated that any number of additional, or fewer, amplifier chambers may be provided), between a mirror 41 and a partially reflective output coupler 42, which together form an optical resonator. Each of the chambers PA4, PA5, PA6 may comprise an optical gain medium made up of the same mixture of gasses, and may therefore be maintained at the same pressure. A single window 42 separates the laser 4 from the remainder of the radiation source SO. In use, photons emitted within the laser 4 travel between the mirrors 41, 42 through the amplifier chambers PA4, PA5, PA6 increasing in power (through interaction with the optical gain medium) until a desired threshold power is attained, at which threshold power a portion of the laser light exits the laser 4 through the window 42. An arrow 43 illustrates propagation of the photons within the laser 4 between the mirror 41 and the output coupler 42. An arrow 44 illustrates the propagation of the output beam of the laser 4 towards the focusing optics 35 and the fuel target 36.

Figure 5:
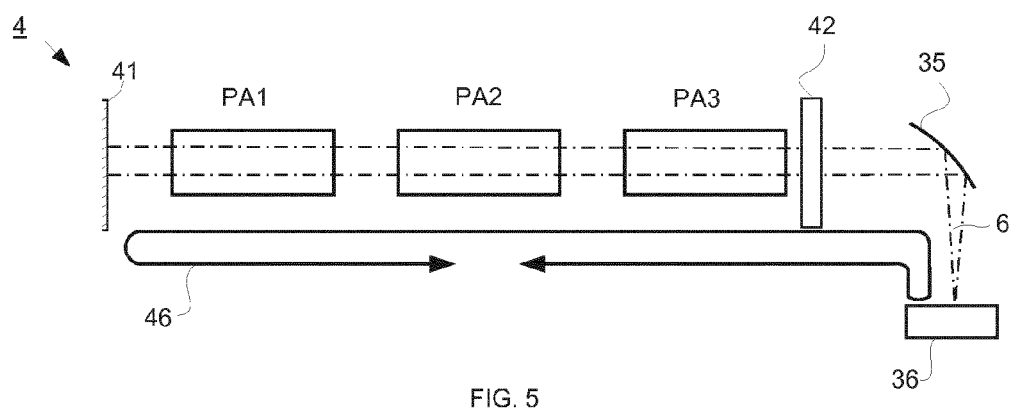
FIG. 5 is a schematic illustration of an alternative continuous-wave laser for use in an LPP radiation source according to an embodiment of the present invention.

FIG. 5 schematically depicts an alternative example of the laser 4 for use with the radiation source SO FIGS. 1 and 2. In the configuration of FIG. 5, the laser 4 is arranged similarly to the laser 4 of FIG. 4, with like components being provided with the same reference numerals. In the laser 4 of FIG. 5, however, the reflective surface of the fuel target 36 acts as a second mirror, in place of the partially reflective output coupler 42. That is, the fuel target 36 and the mirror 41 together provide the optical resonator. In this way, there is avoided the need to provide a separate output coupler which, like the window 42 is subject to relatively high radiation levels and may therefore deteriorate over time. An arrow 46 illustrates the propagation of the laser between the mirror 41 and the fuel target 36, and back again.

In the configurations of both FIG. 4 and FIG. 5, there is no requirement to separate the chambers PA4, PA5, PA6 from one another because they may be maintained at the same pressure. Because the chambers PA4, PA5, PA6 need not be separated by windows, which may deteriorate and deform, the lifetime of the laser 4 may be improved in comparison with the laser 30. Additionally, in comparison with the laser 30, the absence of windows separating the amplifier chambers makes repair of the laser 4 more straightforward. The laser 4 is also less susceptible to disruption from back reflection, and in particular to gain stripping, in comparison to the laser 30.

Because the lasers described with reference to FIGS. 4 and 5 are continuous-wave lasers, the continuous laser beam is focused more narrowly than the laser pulses produced by the laser of FIG. 3 in order to attain the required irradiation at the plasma formation location. For example, for a continuous-wave laser 4 having a power of 100 kW, the laser beam 6 may be focused to an area with a diameter of approximately 100 μm to achieve an irradiance of approximately $2\times10^{10}$ W/cm$^2$. While it is necessary to focus the continuous-wave laser beam 6 more narrowly than is generally the case for pulsed laser beams, this provides a smaller plasma diameter 10 and therefore a beneficially smaller etendue at the intermediate focus 16.

Figure 6:
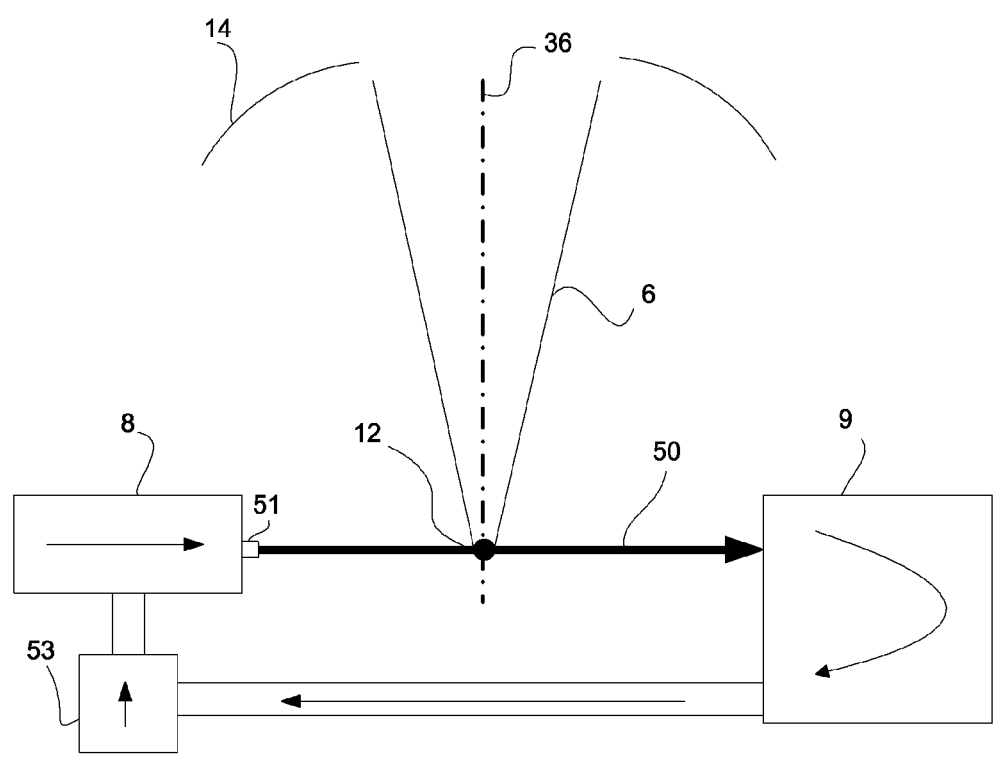
FIG. 6 is a schematic illustration showing a part of the LPP radiation source of FIG. 5 in more detail.

FIG. 6 schematically illustrates the radiation source SO of FIG. 2 in further detail according to an embodiment of the invention. In the embodiment of FIG. 6, rather than providing a fuel in droplet form, the fuel stream generator 8 is arranged to provide a jet 50 from a nozzle 51, the jet 50 being continuous (i.e., not formed from a plurality of droplets) between the nozzle 51 and the fuel jet trap 9. The nozzle 51 may be comprised of, for example, Tungsten, Molybdenum, or an alloy thereof. The nozzle may be resistant to damage caused by tin debris and may allow for high operational temperatures (for example, up to 1000° C.). Tolerance of high operational temperatures may be required to prevent degradation of the nozzle 51 which may result from high temperatures experienced in the vicinity of the plasma formation location. Additionally, or alternatively, the nozzle 51 may be coated with a disposable coating, such as a tin coating. Furthermore, the plasma formation location may be chosen to be a minimum distance from the nozzle 51. For example, the plasma formation location may be a minimum of 10 mm from the nozzle 51 such that heat from the plasma generated at the plasma formation location and energy of tin debris has dissipated to some degree at the location of the nozzle 51.

The fuel jet trap 9 is arranged to receive unspent fuel (i.e., fuel which was not converted into a plasma state by the laser beam 6). Unspent fuel arriving at the fuel jet trap 9 may be re-circulated to the fuel jet generator 8 via a fuel pump 53. In alternative embodiments, the fuel that is captured by the fuel jet trap 9 may be processed externally to the radiation source SO, before being re-circulated within the radiation source SO. The collector 14 is shown as a normal incidence collector, but in other embodiments could be a grazing incidence collector, or any other suitable form of collector.

The jet 50 is ejected from the nozzle 51 at a speed sufficient to continuously supply new fuel at the plasma formation location. Generally, jet speeds may typically be within the range of 25 m/s and 100 m/s, though the exact jet speeds will depend upon the desired size of the fuel jet at the plasma formation location. In order to maintain the continuous nature of the jet 50, the jet may be formed with dimensions that ensure that plasma generated does not burn through the jet 50.

Further, by using a continuously renewing fuel target such as the fuel jet 50, heat, which is continuously generated by the continuous-wave laser beam 6, is efficiently removed by the transport of unspent fuel to the fuel jet trap 9. The combination of a continuous-wave laser beam 6 with a continuously renewing fuel target therefore synergistically solves a number of the problems in providing an increase in the power of generated EUV radiation for lithography machines, and furthermore does so by deviating from the previously accepted approach in the field of improving the qualities of a pulsed laser, a droplet stream generator, and/or the accuracy with which pulsed laser is directed toward a droplet fuel target.

Figure 7:
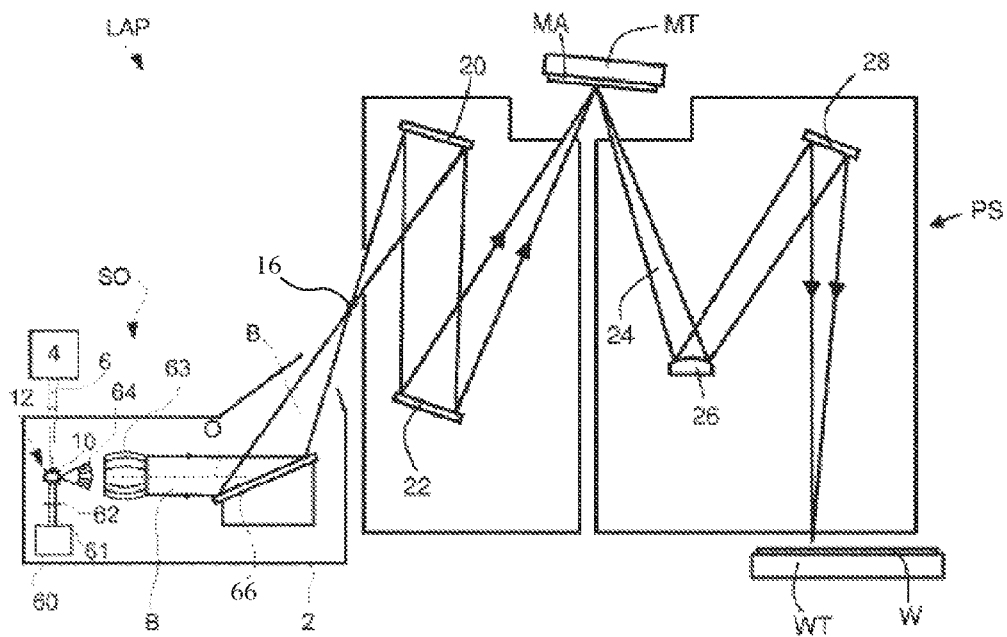
FIG. 7 is a schematic illustration of the apparatus of FIG. 1 according to a different embodiment of the present invention, including an LPP radiation source comprising a grazing incidence radiation collector.

FIG. 7 schematically depicts the lithographic apparatus LAP in more detail according to an alternative embodiment than that shown in FIG. 2. With the exception of the radiation source SO, the lithography apparatus LAP of FIG. 7 corresponds to that shown in FIG. 2 and like components have been provided with like reference numerals. Unlike the embodiment of FIG. 2, the continuously renewing fuel target is not provided by a fuel jet target. In the embodiment of FIG. 7, the radiation source SO comprises a fuel bath 60 containing liquid fuel (e.g., liquid tin). A disk 61 is arranged to rotate about an axis 62, with a portion of an edge of the disk 61 submerged in the fuel bath 60. As the disk 61 rotates, a thin layer of liquid fuel is deposited around the edge of the disk 61, thereby creating a continuously renewing fuel target around the edge of the disk 61 at a plasma formation location 12.

A laser 4 is arranged to deposit laser energy via a laser beam 6 onto the continuously renewing fuel target at the plasma formation location 12. The deposition of laser energy into the layer of liquid fuel around the edge of the disk 61 creates a highly ionized plasma 10 at the plasma formation location 12 which has electron temperatures of several tens of electronvolts (eV). The energetic radiation generated during de-excitation and recombination of these ions is emitted from the plasma 10 and collected and focused by a grazing incidence collector 63 positioned forward of the plasma formation location 12. The grazing incidence collector 63 is a nested collector with a plurality of grazing incidence reflectors disposed axially symmetric around an optical axis O.

A debris mitigation device 64 is provided between the plasma formation location and the grazing incidence collector 63. In the illustrated embodiment, the debris mitigation device takes the form of a rotating foil trap. The rotating foil trap comprises a plurality of vanes arranged around a central axis substantially parallel to the optical axis 36 of the EUV radiation generated by the plasma at the plasma 10. The vanes are rotatable about the axis by a motor (not shown) at a speed sufficient to capture particle debris, generated by the creation of the plasma 10, thereby preventing the captured debris from impacting the grazing incidence collector 63 and other components of the radiation source SO and other, downstream, components of the lithography apparatus LAP. As a result of the rotation, the captured debris may be sprayed off towards a debris catch (not shown).

Radiation B that is reflected by the radiation collector 14 is reflected and focused by a reflector 66 to an intermediate focus 16.

As discussed above with reference to FIG. 2, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

Figure 8:
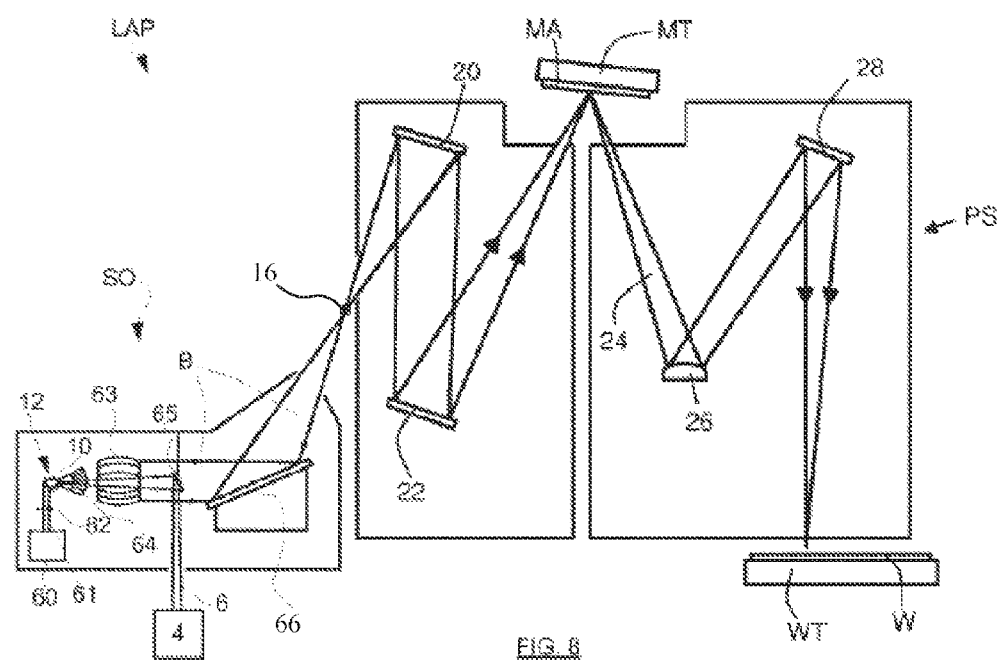
FIG. 8 is a schematic illustration of an alternative configuration of the apparatus of FIG. 7

It will be appreciated that while the laser 4 is depicted as being directly above the plasma formation location 12 in the embodiment of FIG. 7, the laser 4 may be placed in any convenient location. For example, FIG. 8 illustrates an alternative embodiment in which the laser 4 is arranged to direct the continuous-wave laser beam 6 at a mirror positioned between the grazing incidence collector and the reflector 66, the mirror 65 being adapted to direct and focus the laser back towards the disk 61. As such, rather than being perpendicular to the axis 62 of rotation of the disk 61, the direction of propagation of the laser beam 6 is parallel to the axis of rotation of the disk 61 such that the laser beam 6 is incident on the disk 61 in a plane perpendicular to the axis of rotation. In this configuration, the generated plasma is at least partially constrained in a direction opposite the desired direction of propagation of the EUV radiation by the face of the disk 61 upon which the laser beam 6 is incident.

While debris mitigation devices, such as rotating foil traps, may absorb a portion of EUV radiation that is generated by the plasma 10, the ability to tolerate larger quantities of debris, allows the use larger quantities of fuel and more powerful lasers. For example, a laser which may be configured to provide a 40 kW pulsed laser beam can be configured to provide an 80 kW continuous-wave laser beam without substantial modifications. Use of a continuously renewing fuel target (such as a jet or rotating disk) allows the laser to be more effectively used in a continuous-wave mode and thereby provide such an increase in the power output by the laser over a pulsed-beam equivalent laser. It has been found that debris mitigation devices, such as rotating foil traps, do not absorb all of the increase in EUV radiation that is achieved by combining a continuous-wave laser and a continuously renewing fuel target. As such, a net increase in EUV radiation may be provided through use of a continuous-wave laser incident upon a continuously renewing fuel target, even in embodiments in which debris mitigation devices are employed.

Components described with reference to one embodiment above, may be combined with components described with reference to another embodiment. For example, while no debris mitigation device was described with reference to the embodiment of FIG. 2 above, it is to be appreciated that any suitable debris mitigation device may be provided in combination with components shown in FIG. 2. For example, a rotating foil trap, a static foil trap, or a gas barrier may be provided. Similarly, while the embodiment of FIG. 2 utilises a normal incidence collector 14, it is to be understood that any suitable collector, including a grazing incidence collector may be used with the embodiment of FIG. 2.

That is, however the continuously renewing fuel target is provided (whether by continuous jet, a rotating disk, or otherwise), any combinations of radiation collectors, debris mitigation devices and optical components may be used.

It will further be appreciated that while, in the embodiments described above, the laser 4 is a $CO_2$ laser, any appropriate laser may be used. For example, in some embodiments of the present invention, other gas lasers may be used, while in other embodiments of the present invention, solid state lasers may be used, such as, for example, YAG lasers.

In comparison with radiation sources comprising fuel stream generators arranged to provide droplet targets, use of jet targets requires the pumping of a significantly greater volume of liquid fuel over a given period. As such, it may be beneficial to the operation and longevity of components such as the fuel jet generator 8, the fuel jet trap 9 and the fuel pump 43 if operating temperatures of these components can be reduced. The composition of the fuel used to form the jets may therefore be selected for lower temperature operation. For example, the fuel may be an eutectic alloy. For example, a fuel comprising an alloy of tin and gallium, or an alloy of tin and indium may allow room-temperature operation.

In some embodiments of the invention, a plurality of laser beams may be directed at a fuel target, in order to increase the power of the radiation incident on the fuel target. By increasing the power of the radiation incident on the fuel target, EUV radiation with greater power may be provided. As an example, to provide 300 kW of laser power at the fuel target, thirty lasers, each with a respective power of 10 kW may be combined. However, if each laser has the same wavelength the resulting beam waist is subject to interference. In particular, interaction between each respective laser is such that simply overlapping the beams produced by each respective laser results in an area of incidence on the fuel which is too large to obtain radiation with a desired power density incident at the fuel target.

Figure 9:
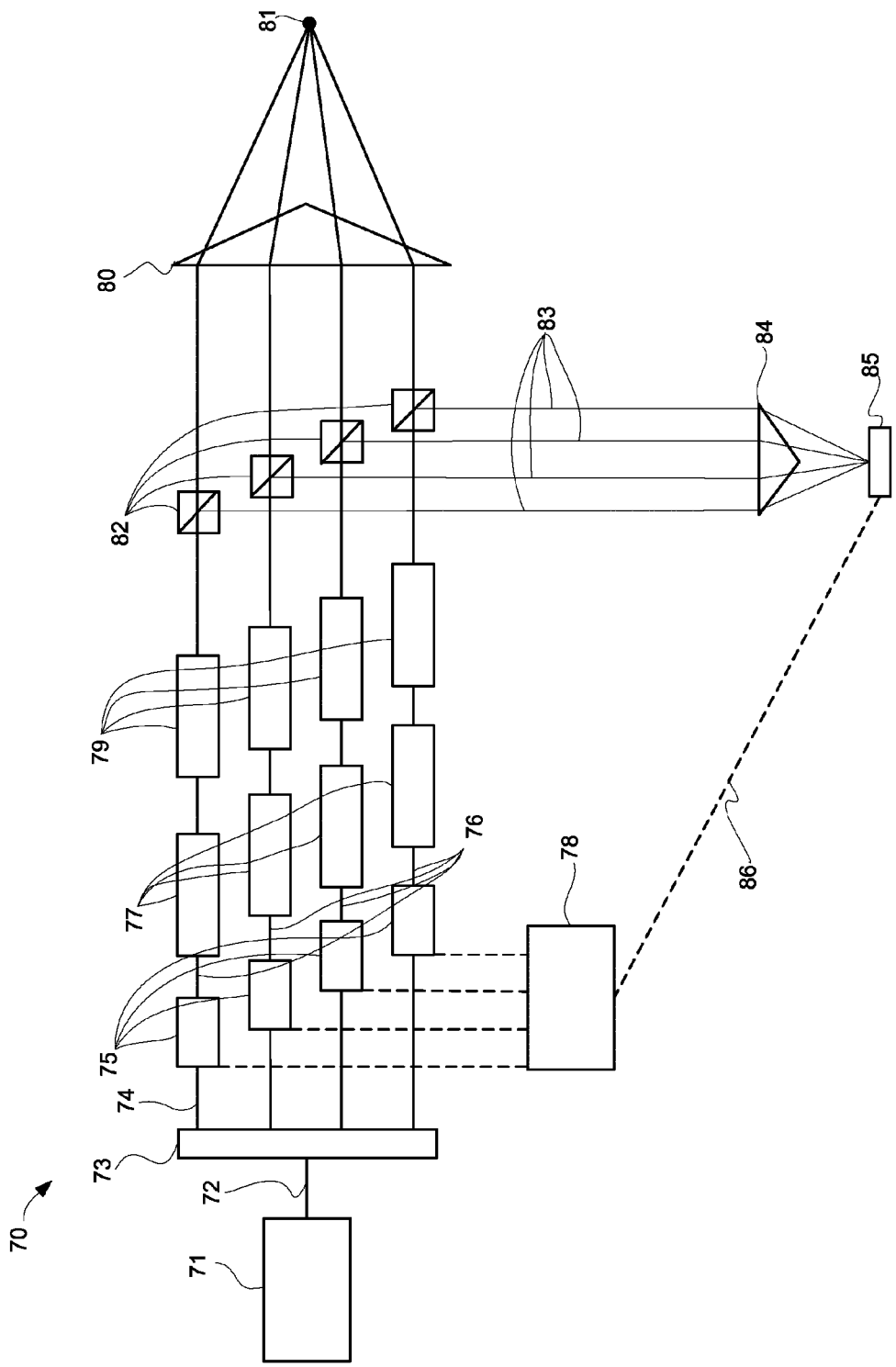
FIG. 9 schematically depicts a laser arrangement according to another embodiment of the present invention.

Referring to FIG. 9, there is schematically illustrated an alternative laser arrangement 70, suitable for directing a plurality of laser beams at a fuel target. A seed laser 71 (which may be, for example a $CO_2$ laser), provides a seed laser beam 72 to a beam splitter 73, which separates the seed laser beam 72 into a plurality of laser beams 74, each laser beam 74 having the same frequency. While FIG. 9 illustrates the seed laser beam 72 being split into four laser beams, it is to be understood that any number of laser beams may be used as determined by application-specific requirements. The seed laser 71 may be a continuous-wave laser or may operate in what is commonly termed a "quasi-continuous wave" mode in which the laser operates only for certain time intervals, wherein the time intervals are sufficiently long for the laser to be substantially in continuous-wave mode during the operational time intervals.

The laser beams 74 are each provided to a respective one of a plurality of phase adjusters 75, each phase adjuster 75 being configured to modulate a respective laser beam 74 to provide a respective modulated laser beam 76. In particular, each phase adjuster 75 is configured to modulate the phase of a respective laser beam 74 according to instructions provided by a controller 78. The operation of the controller 78 is described in further detail below. In general terms, however, the controller 78 is operable to control the phase adjusters 75 to obtain a desired property of laser radiation incident at the fuel target.

Each modulated laser beam 76 is provided to a respective one of a plurality of amplifiers 77. While in the embodiment illustrated in FIG. 9, each modulated laser beam 76 is provided to a single amplifier 77, it is to be understood that any number of amplifiers may be used in connection with each respective modulated laser beam 76. In some embodiments of the invention, the amplifiers may be fiber amplifiers.

From the amplifiers 77, each modulated laser beam 76 is directed to a respective one of a plurality of laser conditioning components 79. The respective laser conditioning components 79 may comprise any appropriate components as required to further condition the modulated laser beams 76. For example, the laser conditioning components 79 may comprise delivery optics configured to direct each modulated laser beam 76 to a focusing element 80. Alternatively or additionally, the laser conditioning components 79 may comprise components such as amplifiers, optical isolators, and/or phase rotators.

The focusing element 80 is configured to combine the individual modulated laser beams 76 and direct them at a target point 81 (which may be where a fuel is delivered for EUV radiation generation, sometimes referred to herein as the plasma formation location). Often, the target point 81 is at or near the focal point of the focusing element 80. The focusing element 80 may take any appropriate form and may be, for example, a plurality of focusing elements. For example, the focusing element 80 may comprise a respective focusing element for each of the modulated laser beams 76. In other embodiments, respective subsets of focusing elements may serve to focus respective subsets of laser beams toward the target point 81.

The laser arrangement of FIG. 9 further comprises a first sensor arrangement. The first sensor arrangement comprises a plurality of beam splitters 82, each beam splitter 82 being positioned in the path of a respective one of the modulated laser beams 76, between the laser conditioning components 79 and the focusing element 80. The first sensor arrangement further comprises a second focusing element 84 and a first sensor 85.

Each of the beam splitters 82 is configured to direct a respective first portion 83 of a respective one of the modulated laser beams 76 towards the second focusing element 84. The second focusing element 84 is configured to combine the individual first portions and to direct them at a point on the first sensor 85. The first sensor 85 is configured to determine one or more properties of the combined laser radiation incident on the first sensor 85. The information determined by the first sensor 85 about the combined laser radiation incident thereon provides an analogue for the combined modulated laser beams 76 incident at the target point 81. For example, the sensor 85 may be configured to determine an intensity of the combined laser radiation incident thereon to provide a proxy of the combined laser radiation incident at the target point 81. The first sensor 85 may be implemented in any appropriate way, and in some exemplary embodiments may comprise a photodetector such as a single photodiode, a split photodiode, an active pixel sensor (APS) and/or a charge coupled device (CCD) image sensor. The first sensor 85 may measure the radiation incident thereon with a frequency which is equivalent to or less than the frequency of the radiation. In some embodiments, the first sensor 85 allows for the detection of the relative phases of the laser beams 76.

The first sensor 85 is configured to provide a signal 86 to the controller 78, the signal 86 comprising information usable by the controller 78 to control the phase adjusters 75. For example, the first sensor 85 may be configured to provide intensity information to the controller 78. By analysing the intensity over time, the controller 78 may determine phase differences between respective ones of the first portions of radiation 83, and by extension, phase differences between corresponding respective ones of the modulated laser beams 76. The controller 78 may then use the information about the phase differences between respective ones of the modulated laser beams 76 to control the phase adjusters 75 to obtain one or more desired properties of the combined laser radiation incident at the target point 81.

Adjustment of phase differences between respective ones of the modulated laser beams 76 allows for the adjustment of the wave front of the combined laser radiation received at the target point 81. The result of controlling the phase of respective ones of the modulated laser beams 76 may be thought of as controlling a pattern of interference of the merged laser beams at the target point 81. Put another way, by adjusting the relative phases of the laser beams 76, the patterns of constructive and destructive interference can be controlled to obtain a desired radiation distribution. In this way, the laser arrangement 70 is able to control the distribution of radiation over the surface of a fuel target to achieve a desired effect.

In one advantageous use of the arrangement of FIG. 9, by controlling the phase adjusters 75 each of the modulated laser beams 76 may be coupled coherently, thereby allowing the modulated laser beams 76 to provide a more stable merged beam with a higher power density at the target point 81 than would be possible if the modulated laser beams 76 were incoherently spatially merged. In particular, by controlling the phase adjusters 75 to produce respective modulated laser beams 76 with substantially the same phase (i.e. zero phase difference within predetermined acceptable tolerances), a maximum power density may be provided at the target point 81. Providing a higher power density on a fuel target at the target point 81 allows for the generation of higher power EUV radiation. Providing modulated laser beams 76 which have substantially zero phase difference may be considered to be providing a "flat" pattern of interference. Other patterns of interference may also be generated using embodiments of the present invention. As a further example, by controlling the phase adjusters 75 such that there is an equal phase difference between each neighboring one of the modulated beams 76, a "gradient" pattern of interference can be provided at the target point 81.

Adjustment of the profile of the radiation distribution incident on a fuel target allows for control of the direction of debris propagation, and for control over the angular distribution of laser radiation reflected from the fuel target. For example, phase differences between the modulated beams 76 may be configured to provide a dipole or quadruple pattern at the target point 81. Such patterns can be used to reduce reflection of laser radiation from the target point 81 in a direction of the substrate.

As another example, while it is described above that EUV radiation having a maximum power can be provided using a "flat" pattern, by varying the power density of the laser radiation at the fuel target 81 through control of the phase adjusters 75, the amount of EUV power may be controlled to result in desired EUV radiation of a desired, non-maximum, power. For example, where it is desired to reduce the amount of generated EUV radiation, the phase adjusters 75 may be controlled to decrease coherence of the modulated laser beams 76 in the focal plane of the fuel target. In some embodiments of the present invention, a power density of generated EUV radiation may be measured by an appropriate sensor and that information provided to the controller 78. The controller 78 may then control the phase adjusters 75 to obtain a suitable level of coherence in the merged laser beam at the target point to generate EUV radiation with a desired power density. A reduction in EUV radiation intensity may therefore be achieved without a change of power of laser radiation that is directed through the focusing element 81 (or any other stage of the arrangement 70) and thus without changes in the final focus caused by thermal expansion/distortion which may result from varying radiation intensity.

A further advantageous use of the laser arrangement 70 is in correcting focus shifts caused, for example, by thermal changes in the focusing element 80. Adjustments to the phase of one or more of the modulated laser beams 76 can be used to compensate for such focal shifts without requiring, and more quickly than, mechanical re-positioning of the focusing element 80.

Figure 10A:
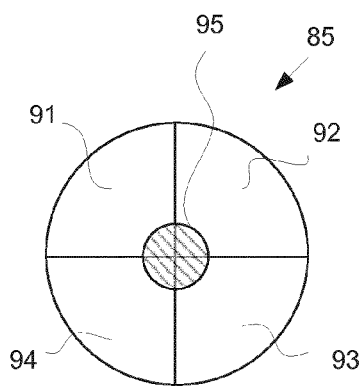
FIGS. 10A, 10B schematically depict a use of a first sensor for use in the laser arrangement of FIG. 9.
Figure 10B:
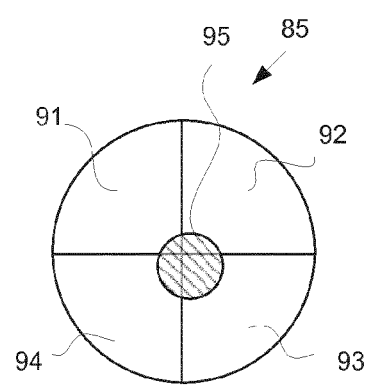

In some embodiments of the present invention, the first sensor 85 may be configured to provide information regarding the focal position of the combined first portions 83 incident on the first sensor 85, and as such the focal point of the combined modulated laser beams 76 incident at the target point 81. Referring to FIGS. 10A, 10B, in some embodiments the sensor 85 comprises a split photodiode having four quadrants 91, 92, 93, 94. In FIG. 10A, a laser spot 95 (i.e. the portion of the surface of the split photodiode illuminated by the merged first portions 83) is at the centre of the split photodiode. That is, in the arrangement of FIG. 10A, each quadrant 91, 92, 93, 94 receives substantially the same amount of radiation from the combined first portions 83. The arrangement of FIG. 10A may be achieved by phase matching each of the modulated laser beams 76 when the optical element 80 is not subject to thermal expansion/shrinkage.

The position of laser spot 95 with respect to the central location (and therefore the position of the merged modulated laser beams 76 with respect to the target point 81) may be adjusted through adjustment of the respective phases of the modulated laser beams 76, as illustrated in FIG. 10B. Similarly, if it is detected that the laser spot 95 moves away from the centre spot (as a result, for example, of thermally induced changes in the optical elements 80, 84), appropriate signals may be provided to the controller 78 to adjust the phase of one or more of the modulated laser beams 76.

Figure 11:
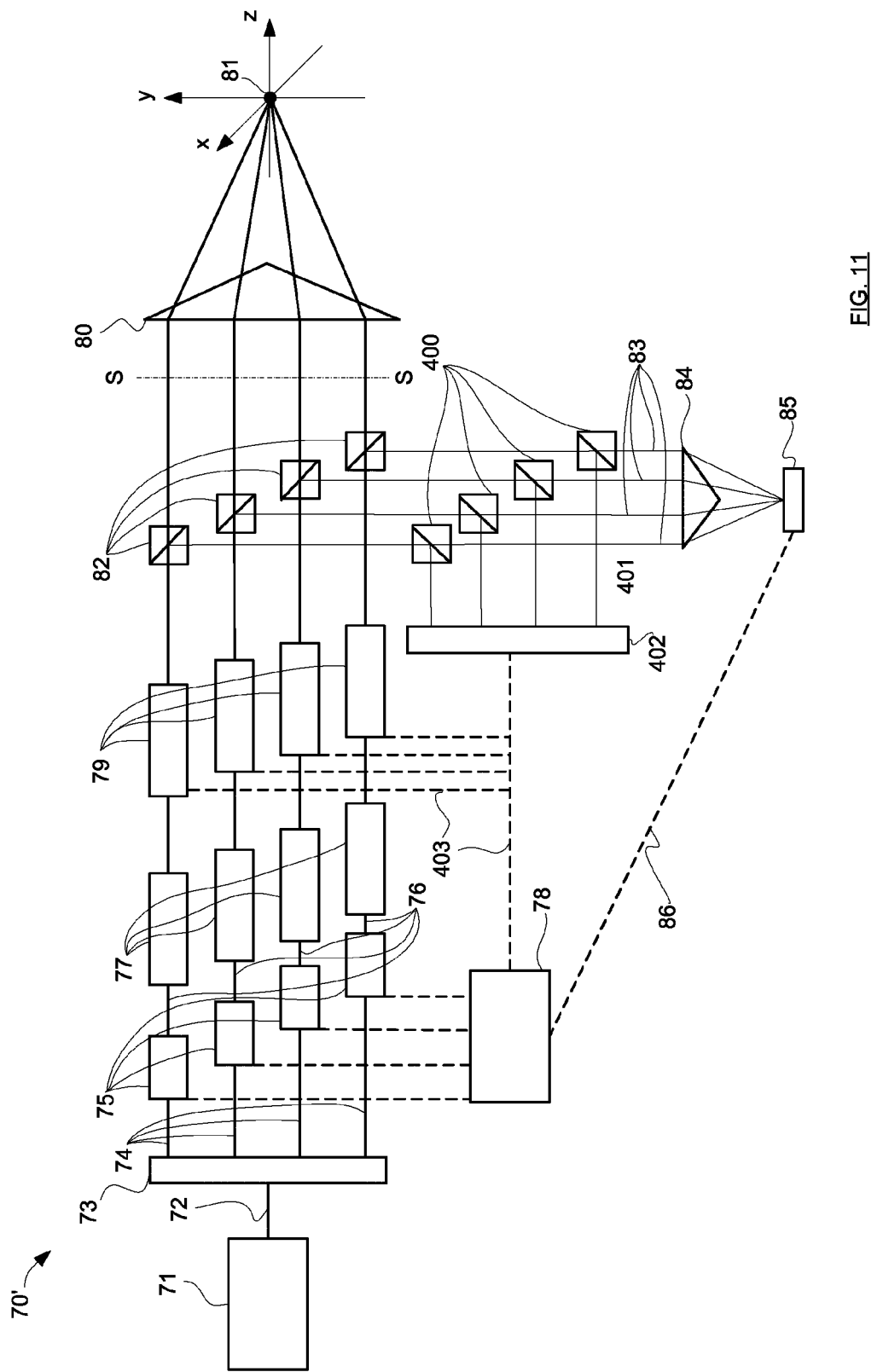
FIG. 11 schematically depicts a laser arrangement according to another embodiment of the present invention.

An alternative embodiment of the present invention is schematically illustrated in FIG. 11. FIG. 11 shows a laser arrangement 70' configured similarly to the laser arrangement 70 illustrated in FIG. 9. Components of the laser arrangement 70' which are the same as those of the laser arrangement 70 have been provided with like reference numerals. The laser arrangement 70' differs from the laser arrangement 70 in that there is provided respective beam splitters 400 in the paths of each of the first portions 83, between the respective beam splitters 82 and the focusing element 84. Each of the beam splitters 400 is arranged to direct respective second portions of radiation 401 to a second sensor 402.

Whereas the first sensor 85 is configured to determine the intensity of the merged beam incident at the first sensor 85, the second sensor 402 is configured to determine properties of respective ones of the second portions 401. The second sensor may be implemented in any appropriate way, and may be, for example a CCD array. In some embodiments, the second sensor 402 operates to determine phase differences between any two of the beams 401, or between a particular reference one of the beams 401 and any other of the beams 401. As with the sensor 85, the sensor 402 is configured to provide a signal 403 to the controller 78.

Although the second sensor 402 is depicted in FIG. 11 as receiving radiation via beam splitters 82 and beam splitters 400, other configurations may be used. For example, in some embodiments the second sensor 402 may be positioned between the laser conditioning components 79 and the focusing element 80. In such embodiments, the second sensor 402 is at least partially transmissive such that at least a portion of the laser beams 76 pass through the second sensor 402 to the focusing element 80.

There is now described an example in which the modulated laser beams 76 are arranged in a rectangular or square array such that an M×N two-dimensional array of modulated laser beams 76 is incident on the plane defined by the line S-S in FIG. 11. The modulated laser beams 76 incident on the plane S-S may be propagate in directions which are substantially parallel to one another and the centers of the modulated laser beams 76 may be substantially equidistance from one another. The plane S-S may be substantially perpendicular to the directions of propagation of the laser beams 76. It is to be understood, however, that this arrangement is merely exemplary, and that other configurations of the modulated laser beams 76 may be used.

The phase differences between the laser beams 76 incident on the plane S-S may be measured by the second sensor 402. A measurement of the phase differences between the laser beams 76, provided by the second sensor 402, may be considered to form a two-dimensional phase matrix P, having dimensions M×N and given by equation (2).

$$P = \begin{bmatrix} P_{1,1} & P_{2,1} & P_{3,1} & P_{4,1} & \ldots & P_{M,1} \\ P_{1,2} & P_{2,2} & P_{3,1} & P_{4,2} & \ldots & P_{M,2} \\ P_{1,3} & P_{2,3} & P_{3,3} & P_{4,3} & \ldots & P_{M,3} \\ \ldots & \ldots & \ldots & \ldots & \ldots & \ldots \\ P_{1,N} & P_{2,N} & P_{3,N} & P_{4,N} & \ldots & P_{M,N} \end{bmatrix} \quad (2)$$

Each element of the phase matrix P corresponds to a single one of the laser beams 76 incident on the plane S-S, with the index (i,j) of each element of the phase matrix P representing the relative positioning of each laser beam 76 incident on the plane S-S. The value of each element $P_{i,j}$ is equal to a phase difference between the laser beam at position (i,j) and phase of the laser beam at the position (1,1). The value of the element $P_{1,1}$ is therefore '0'.

The phase matrix P may be measured by the second sensor 402 and provided via signal 403 to the controller 78. The controller 78 may then adjust the phase of one or more of the modulated laser beams 76 in order to provide a desired phase matrix P. The phase matrix P may be controlled in order to control one or more desired properties of the merged radiation incident at or near to the target point 81. As described above, the modulated laser beams 76 are focused by the focusing element 80 such that the laser beams 76 are merged at the target point 81. The merged beams provide an intensity distribution at the target point 81, in an x-y plane at z=0. As described above with reference to FIG. 10, the laser beams 76 may be combined coherently at the target point 81. Coherent combination of the laser beams 76 may be achieved by controlling the phases of the laser beams 76 such that the phases of all of the laser beams 76 are substantially equal to each other and hence all elements of the phase matrix P are substantially equal to $P_{1,1}$. This provides the tightest intensity distribution in the x-y plane centered on the target point 81.

The phase matrix P may be controlled in order to control the central point of the intensity distribution relative to the focal point of the focusing element 80. The central point of the intensity distribution may be controlled in the x and y directions by controlling the phase matrix P according to equation (3).

$$P_{i,j} = P_{1,1} + ai + bj \quad (3)$$

The combined laser beams 76 may be modeled as a single Gaussian beam propagating from the focusing element 80 at an angle β to the x-axis and an angle α to the y-axis. A phase matrix which is controlled according to equation (3) has an intensity distribution whose centre lies at a position in the x-y plane such that $\beta = a\lambda N/(2\pi Y)$ and $\alpha = b\lambda M/(2\pi X)$ where X is the distance in the x-direction between the outermost laser beams 76, Y is the distance in the y-direction between the outermost laser beams 76 and λ is the wavelength of laser beams 76. The position of the central point of the intensity distribution may therefore be controlled by controlling the phase matrix P according to equation (3) by controlling the coefficients a and b in equation (3) in order to control the angles α and β.

The laser beams 76 may interfere with each other after passing through the focusing element 80. The width of the Gaussian intensity distribution may therefore decrease, and subsequently increase, as the merged beam propagates substantially in the z-direction. The position on the z-axis at which the power flux in the merged beam is at a maximum, and correspondingly the intensity distribution is at a minimum and hence the single beam is most focused, may be controlled by controlling the phase matrix P. In particular, the phase matrix P may be controlled such that a central element of the phase matrix P is a maximum or minimum of the phase matrix P. The phase matrix P may further be controlled according to a parabolic function given by equation (4).

$$P_{i,j} = P_{1,1} + ci^2 + dj^2 + ei + fj \quad (4)$$

Where c, d, e and f are fixed angles in units of radians and may take positive or negative values. The angles e, f determine the position in the x-y plane of a maximum power density of the merged laser beams 76 at the focusing element 81. The angles c, d determine an amount of convergence/divergence of the combined laser beams 76. An approximation of a spherical wavefront may be achieved if M=N and c=d.

The phase matrix P may be controlled in order to compensate for thermal expansion or contraction of the focusing element 80. In order to correct for changes in the focusing properties of the focusing element 80 a pattern defined by equation (5) may be applied to the phase matrix P.

$$P_{i,j} = P_{N-i+1, M-j+1} \quad (5)$$

The phase matrix P may be controlled in order to control the shape of the intensity distribution of the radiation at or near to the focal point of the focusing element 80. For example an intensity distribution of radiation at or near to the focal point, comprising a ring of radiation around a central dark spot, may be provided by controlling the phase of an element at $P_{i,j}$ according to equation (6) for locations in the phase matrix for which i<K<N/2 and j<L<M/2.

$$P_{i,j} = P_{N-i+1, M-j+1} = P_{1,1} \quad (6)$$

For locations in the phase matrix P for which N/2>i>K and M/2>j>L the phase matrix P may be controlled according to equation 7.

$$P_{i,j} = P_{N-i+1, M-nj1} - \pi \quad (7)$$

Where K and L are values which control the diameter of the ring of radiation and the size of the dark spot. An intensity distribution of radiation at or near to the focal point of the focusing element 80, comprising a ring of radiation around a central dark spot, may be used to control the direction and composition (ions, vapour or droplets) of debris emitted by the plasma.

Any of the examples of controlling the phase matrix P described above may be combined together in a single embodiment of the invention. In other embodiments of the invention alternative arrangements of the laser beams 76 and the phase matrix P may be employed. Generally, the introduction of an arbitrary phase delay in the laser beams 76 may be considered to be analogous to the use of a free form lens. It will be appreciated that additional configurations of power distribution at the target point 81, and of the position of the focal point are available.

In some embodiments of the invention, the laser conditioning components 79 may comprise components, such as phase rotators, adjustable in response to the signal 403 from the second sensor 402. In this way, additional control over the phase differences between respective ones of the modulated laser beams 76 may be provided.

In some embodiments of the present invention, only one of the first sensor 85 and the second sensor 402 are provided while in other embodiments of the invention, both the sensor 85 and the sensor 402 are provided. Further, in other embodiments of the invention neither the sensor 85 or the sensor 402 are provided. For example, in some embodiments of the invention, a sensor measuring an amount of EUV radiation that is generated when the merged beam is incident on a fuel target may be provided, and that sensor may provide feedback to the controller 78.

Figure 12:
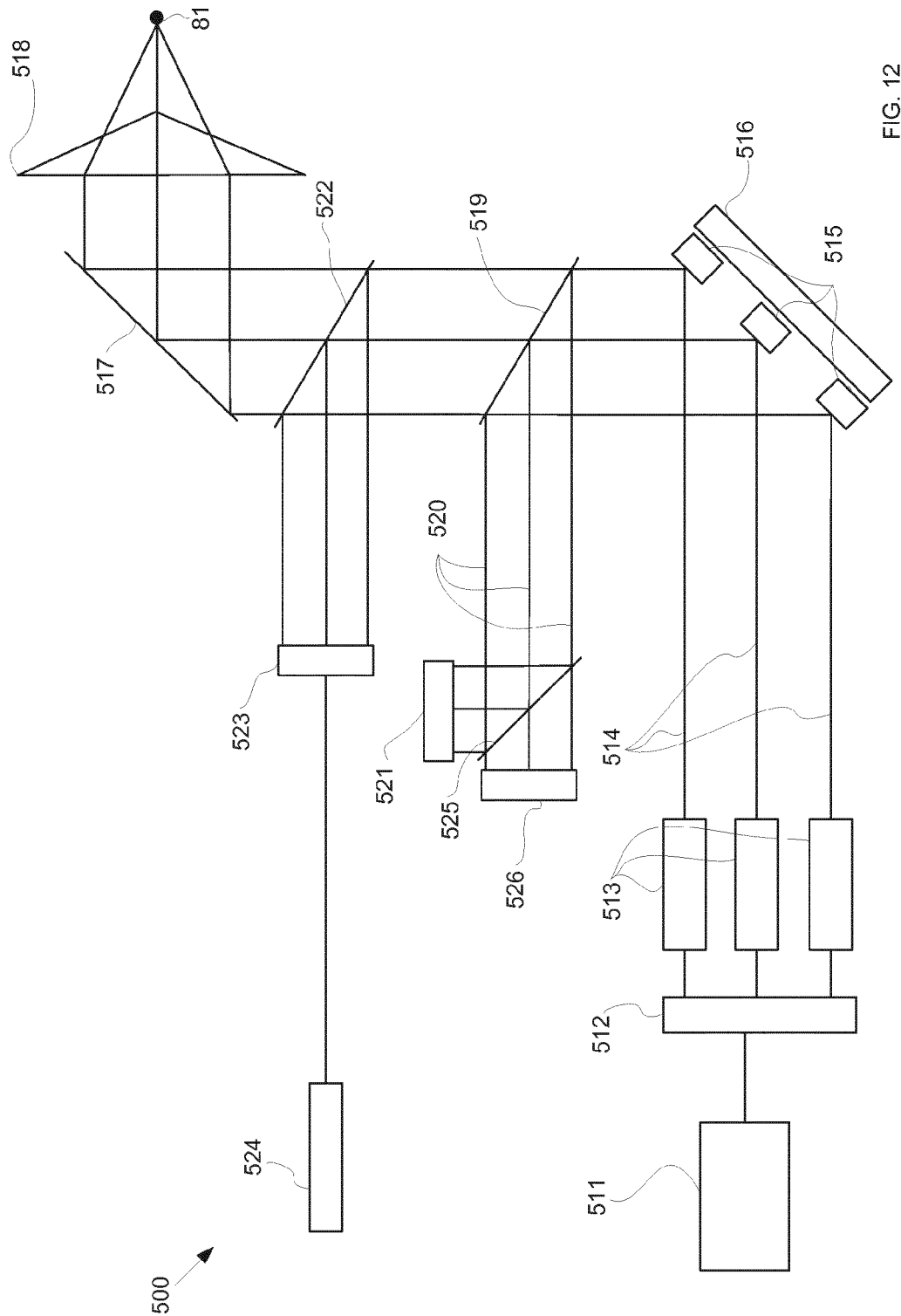
FIG. 12 schematically depicts a laser arrangement according to another embodiment of the present invention, FIG. 13 schematically depicts a multilayer mirror of the lithographic apparatus of FIG. 1.

FIG. 12 illustrates an alternative laser arrangement 500 in which relative phases of a plurality of lasers may be adjusted, to achieve the benefits described above with reference to FIGS. 9 and 11. The arrangement of FIG. 12 comprises a seed laser 511, a beam splitter 512 and a plurality of amplification chambers 513. A seed laser beam produced by the seed laser 511 is split into three laser beams 514 (it being appreciated that any number of laser beams may be provided) by the beam splitter 512 and each of the laser beams 514 is provided to a respective one of the amplification chambers 513.

The laser arrangement 500 further comprises three optical elements 515 configured to direct the respective laser beams 514 to an optical element 517. In turn, the optical element 517 is configured to direct the respective beams to an focusing element 518 arranged to direct and merge the laser beams 514 at a target point 81. The target point 81 may be, for example, a fuel target.

Each of the optical elements 515 is provided on a platform 516, and is moveable with respect to the platform 516 in order to effect changes in the relative phases of the laser beams 514. For example, by shortening or lengthening the path between a source of one of the laser beams 514 and the optical element 518, the phase of that laser beam 514 with respect to the other laser beams 514 may be dynamically adjusted. Similar changes may be effected for all of the laser beams 514 with respect to the other laser beams 514 by movement of the respective optical elements 515.

Each of the optical elements 515 may also be individually tilted to direct a respective laser beam 514 along a different path, thereby adjusting the position of the point 81 at which the resulting merged laser beam is directed.

An optical element 519 is provided in the path of each of the laser beams 514 between the optical elements 515 and the optical element 517. The optical element 519 is arranged to direct a portion 520 of each respective laser beam 514 to a tilt sensor a further optical element 525. The optical element 519 may be implemented in any appropriate way, and may comprise, for example, a mirrored element arranged to reflect a portion of incident radiation, while allowing a remaining radiation to pass through. The optical element 525 is arranged to direct a first fraction of the portion 520 to a tilt sensor 521 and a second fraction of the portion 520 to a collimation sensor 526. The optical element 525 may for example be a mirror which reflects the first fraction of the portion 520 and transmits the second fraction of the portion 520. The tilt sensor 521 may be, for example, a charge coupled device (CCD), but again may be implemented in any appropriate way as will be apparent to the skilled person. The tilt sensor 521 is configured to determine an amount by which each respective laser beam 514 is tilted and to provide feedback information to a controller (not shown) configured to control actuation of the optical elements 515 to subsequently adjust the tilt of the laser beams 514.

A further optical element 522 is also provided in the path of each of the laser beams 514 between the optical elements 515 and the optical element 517. The optical element 522 is arranged to direct a portion of each respective laser beam 514 to a relative wavefront sensor 523. The wavefront sensor 523 may be implemented in any appropriate way. In some embodiments of the invention, the wavefront sensor 523 may receive a reference signal from a reference laser 524, by which to compare the wavefronts of the laser beams 514.

In the embodiments described above with reference to FIGS. 10 to 12, a laser beam provided by a seed laser is split to provide a plurality of laser beams which are subsequently merged. In other embodiments of the invention, a plurality of lasers may provide the laser beams which are subsequently merged. For example, a plurality of fibre lasers may provide the laser beams that are subsequently merged. Indeed, it is to be appreciated that the plurality of laser beams which are subsequently merged may be provided by any appropriate laser or plurality of lasers.

Figure 13:
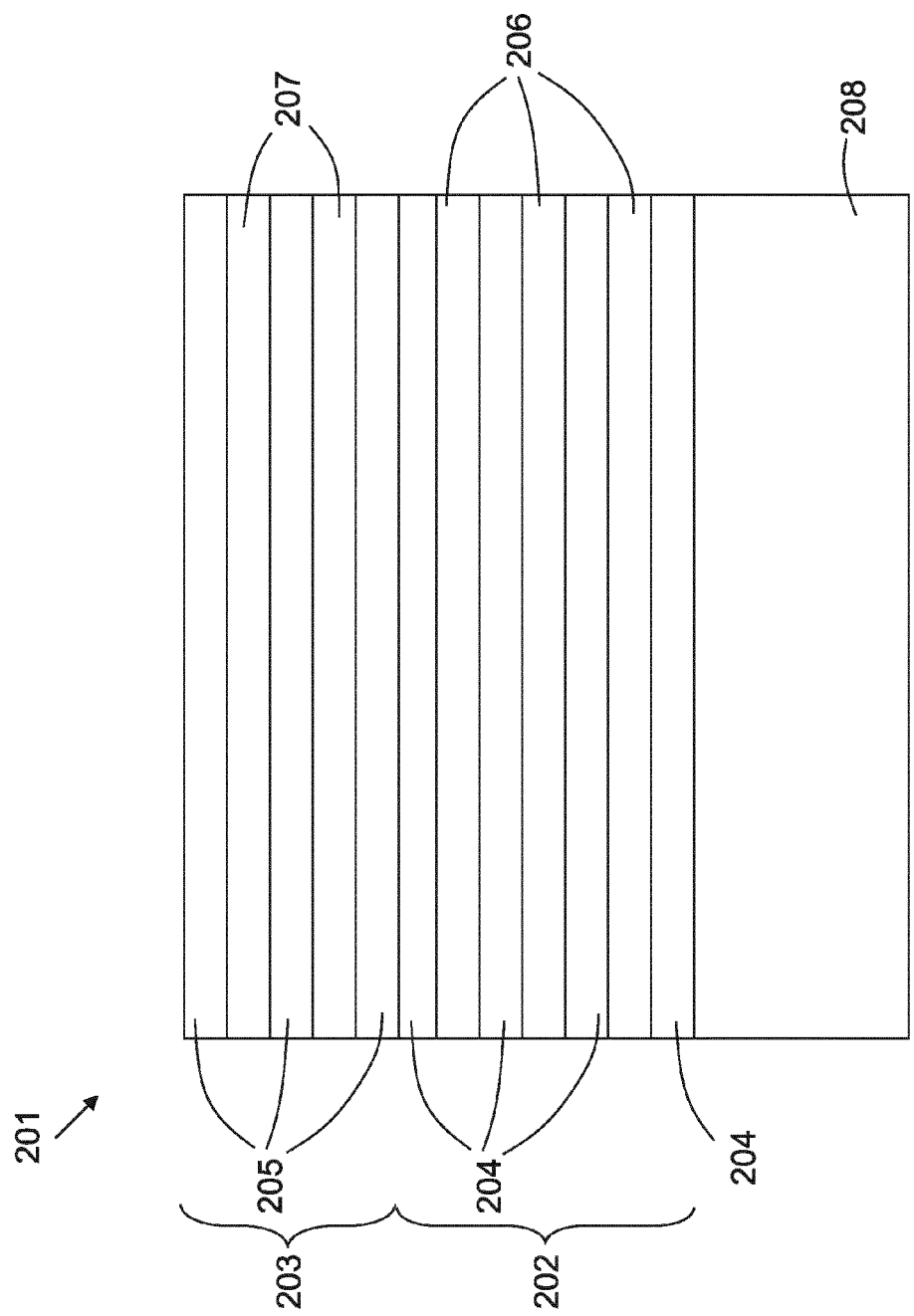

FIG. 13 depicts an embodiment of multilayer mirror 201. The multilayer mirror 201 is constructed and arranged to reflect radiation having a wavelength in the range of 2-20 nm. The multilayer mirror comprises a first portion 202 which has alternating layers 204, 206 supported by a substrate 208. The multilayer mirror 1 further includes a second portion 203 which comprises alternating layers 205, 207. The second portion 203 forms a capping layer on top of the first portion 202.

The alternating layers 204, 206 are typically silicon layers 204 and molybdenum layers 206. The alternating layers 205, 207 of the second portion 203 may respectively be diamond-like carbon layers 205 and silicon layers 207, boron carbide layers 205 and silicon nitride layers 207, diamond-like carbon layers 205 and silicon nitride layers 207 and/or boron carbide layers 205 and silicon nitride layers 207. An example of boron carbide is $B_4C$. Another example is $B_9C$. An example of silicon nitride is $Si_3Ni_4$.

Figure 14:
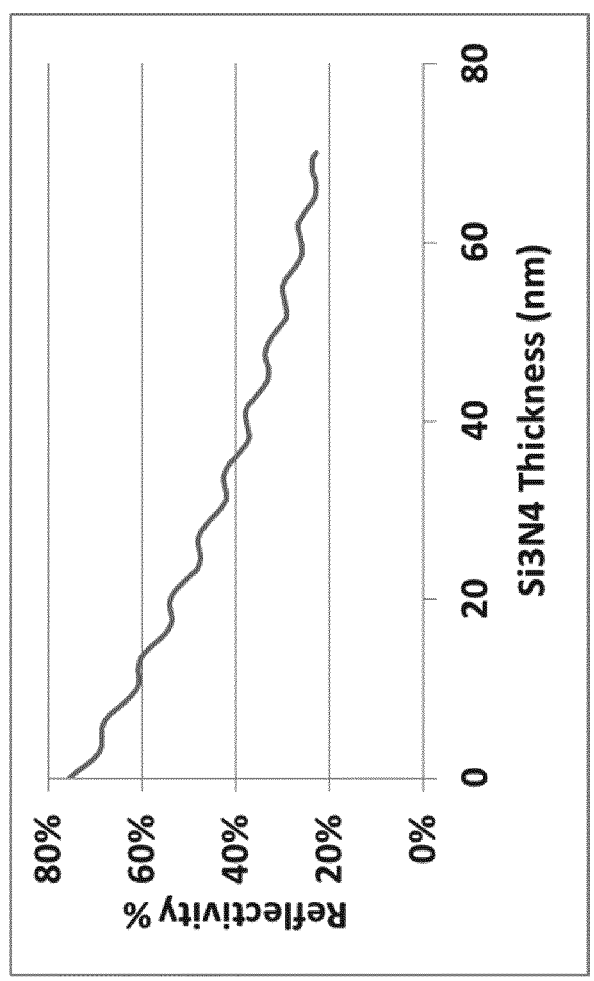
FIG. 14 is a graph that shows reflectivity of a multilayer mirror with a $Si_3N_4$ layer on top.

In the past, it has been proposed to use a $Si_3Ni_4$ layer instead of the second portion 203 disclosed in FIG. 13. FIG. 14 is a graph that shows reflectance R as a function of layer thickness. It can be seen that reflectivity drops below 40% even before the $Si_3Ni_4$ layer thickness reaches a thickness of 40 nm.

Figure 15:
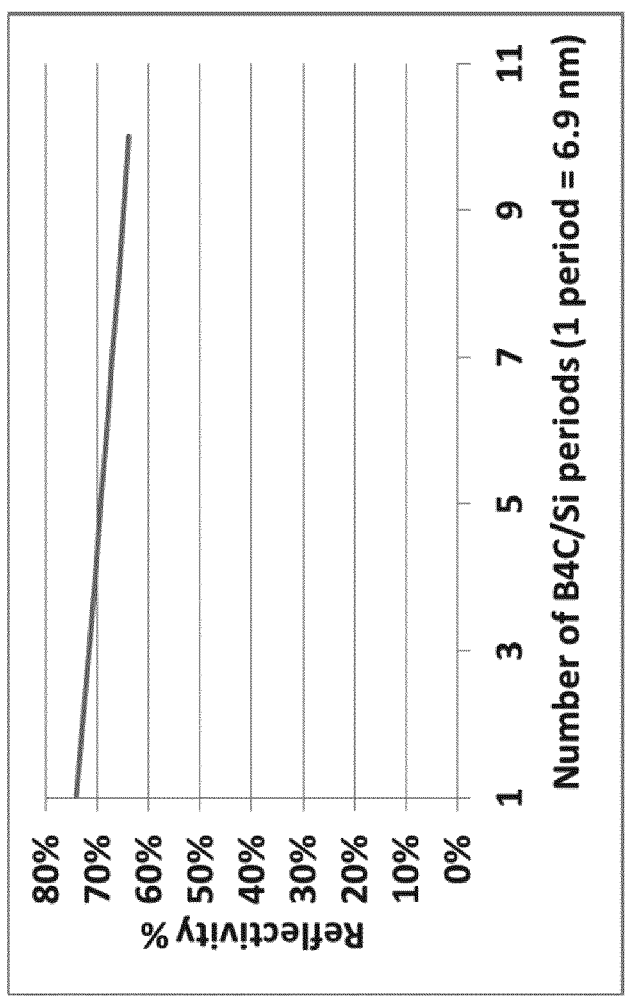
FIG. 15 is a graph that shows reflectivity of an embodiment of the multilayer mirror of FIG. 13.

FIG. 15 is a graph that shows reflectivity of an embodiment of the multilayer mirror 201 having the aforementioned first portion 202 and second portion 203. More specifically, the second portion 203 includes diamond-like carbon layers 205 and silicon layers 207. As can be seen when comparing FIGS. 14 and 15, reflectivity is not as adversely affected for diamond-like carbon/silicon multilayers as for a $Si_3Ni_4$ layer.

Figure 16:
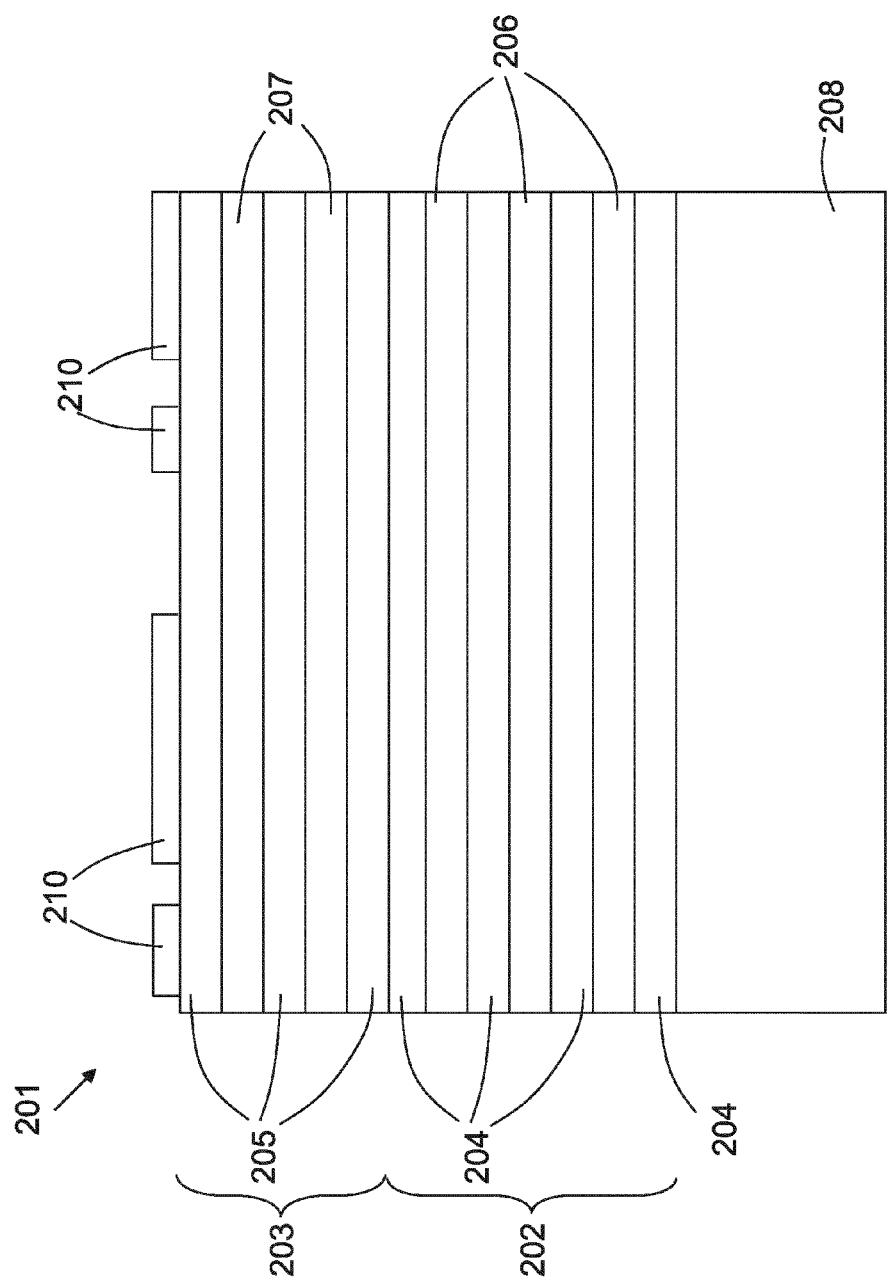
FIG. 16 depicts an embodiment of the multilayer mirror of FIG. 13.

An embodiment of the multilayer mirror 1 is shown in FIG. 16. This embodiment is a reflective reticle. In addition to the features of the multilayer mirror of FIG. 3, the embodiment of FIG. 15 may be provided with a structure 10 having an absorptive material which is arranged to define the pattern of its surface. Suitable materials to be employed as the absorptive material may be chromium, titanium, silicon, ruthenium, molybdenum, tantalum, aluminium or any combination thereof.

Typically, the first portion 2 of the mirror 1 is formed by a number of 30 to 200 periods of alternating layers, i.e., a total number of layers between 60 and 400. The second portion 203 may, for instance, be formed of about 10 periods, i.e., a total number of layers of about 20. In that respect, it should be noted that the figures are schematic figures serving merely as illustrations and that they are not scale drawings.

Figure 17:
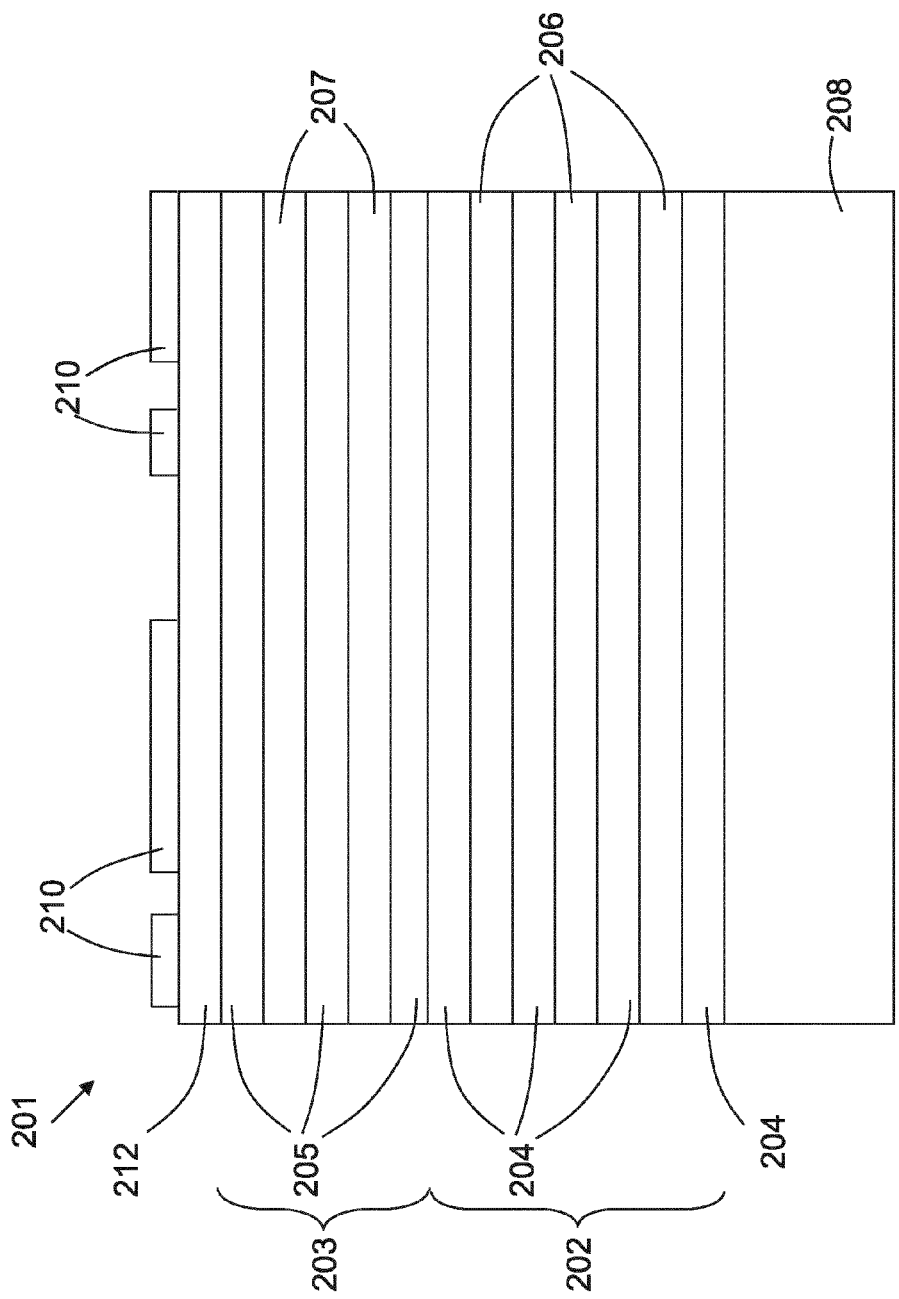
FIG. 17 depicts a modification of the embodiment of the multilayer mirror of FIG. 16.

Another embodiment is depicted in FIG. 17. The embodiment of FIG. 17 is similar to the embodiment of FIG. 16. However, in the embodiment of FIG. 17, the mirror 201 is provided with a capping layer 212. The capping layer 212 may comprise ruthenium, tantalum, titanium, rhodium or any combination thereof. Such a capping layer may be suitably arranged to protect the layered structure of the multilayer mirror 201 against chemical attack. A suitable thickness for the capping layer may be anywhere within the range of 0.5 to 10 nm.

It will be apparent to a person skilled in the art that the invention is not limited to the embodiments disclosed hereabove. For instance, the multilayer mirror may be a normal-incidence collector mirror. Typically, such mirrors have an ellipsoid surface, as well as a first focal point and a second focal point. Radiation emitted from the first focal point and reflected by the mirror is then directed toward the second focal point. If the distance between two subsequent radiation-facing surfaces at a location on the mirror at which radiation emitted from the first focal point is incident perpendicular to the surface is d, then the distance between two subsequent radiation-facing surfaces at a location on the mirror at which radiation emitted from the first focal point is incident at an angle of a with respect to the normal of the surface equals about d/cos a. For instance, the distance d between two subsequent radiation-facing surfaces at a location on the mirror at which radiation emitted from the first focal point is incident at an angle of 0 degrees with respect to the normal of the surface may be 6.9 nm. Then, at a location on the mirror at which radiation emitted from the first focal point is incident at an angle of 30 degrees with respect to the normal of the surface, this distance is 6.9 nm/cos (30 degrees)≈8 nm.

Also, anti-diffusion layers may be provided, for example, between the first portion and the second portion or between subsequent molybdenum and silicon layers of the first portion. Such layers may comprise or consist of boron carbide.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the clauses set out below.

1. A multilayer mirror constructed and arranged to reflect radiation having a wavelength in the range of 2-20 nm, the multilayer mirror having a first portion and a second portion, each of the portions having alternating layers, the alternating layers of the first portion consisting of first layers and second layers, the first layers being molybdenum layers and the second layers being silicon layers, the alternating layers of the second portion consisting of layers being formed by one or more di-electric materials and layers of silicon and/or silicon nitride.

2. The multilayer mirror according to clause 1, wherein at least one of the di-electric materials is selected from the group consisting of diamond-like carbon and boron carbide.

3. The multilayer mirror according to clause 1 or 2, wherein the second portion is located on top of the first portion, one of the layers formed by one or more di-electric materials abutting a silicon layer of the first portion or one of the layers of silicon nitride abutting one of the molybdenum layers.

4. The multilayer mirror according to clause 1, 2 or 3, wherein the first portion is provided with an anti-diffusion layer between one or more pairs of adjoining silicon and molybdenum layers.

5. The multilayer mirror according to any one of the preceding clauses, wherein the mirror is provided with an anti-diffusion layer between the first portion and the second portion.

6. The multilayer mirror according to any one of the preceding clauses, wherein each of the layers formed by the di-electric material has a radiation-facing surface, an inward-facing surface and a thickness that is between about 0.4 times and 0.6 times the distance between two subsequent radiation-facing surfaces.

7. The multilayer mirror according to any one of clauses 1-5, wherein each of the layers formed by the di-electric material has a radiation-facing surface and an inward-facing surface and wherein the distance between two subsequent radiation-facing surfaces about 6.9 nm or higher.

8. The multilayer mirror according to any one of clauses 1-5, wherein the mirror has a first focal point and a second focal point, the mirror being is constructed and arranged to reflect radiation emitted from the first focal point onto the second focal point, wherein each of the layers formed by the di-electric material has a radiation-facing surface and an inward-facing surface.

9. The multilayer mirror according to clause 8, wherein the distance d between two subsequent radiation-facing surfaces is between about 6.9 nm and about 7.0 nm at a location on the mirror at which radiation emitted from the first focal point is incident at an angle of 0 degrees with respect to the normal of the surface.

10. The multilayer mirror according to clause 8 or 9, wherein the distance between two subsequent radiation-facing surfaces at a location on the mirror at which radiation emitted from the first focal point is incident at an angle of α with respect to the normal of the surface equals about $$\frac{d}{\cos\alpha},$$

d being the distance between two subsequent radiation-facing surfaces at a location on the mirror at which radiation emitted from the first focal point is incident at an angle of 0 degrees with respect to the normal of the surface.

11. A radiation source constructed and arranged to generate radiation having a wavelength in the range of 2-20 nm, the radiation source comprising a multilayer mirror according to any one of the preceding clauses.

12. A projection system configured to project a patterned radiation beam onto a target portion of a substrate, the projection system comprising a multilayer mirror according to any one of claims 1-10.

13. An illumination system configured to condition a radiation beam, the illumination system comprising a multilayer mirror according to any one of clauses 1-10.

14. A lithographic projection apparatus arranged to project a pattern from a patterning device onto a substrate, wherein the lithographic apparatus comprises a multilayer mirror according to any one of clauses 1-10.

15. The lithographic apparatus according to clause 14, further comprising:
an illumination system configured to condition a radiation beam;
a support structure constructed to hold a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

16. A method of generating radiation, for instance for a lithography apparatus, the method comprising providing a continuously renewing fuel target at a plasma formation location, directing a continuous-wave excitation beam at the plasma formation location such that fuel within the continuously renewing fuel target is excited by the continuous-wave excitation beam to generate a radiation generating plasma 17. A method according to clause 16, wherein providing a continuously renewing fuel target comprises directing a jet from a first location to a second location, the jet being continuous between the first and second locations, the jet comprising a fuel for use in generating the radiation generating plasma, and the jet at least partially intersecting the plasma formation location 18. A method according to clause 1, wherein the continuously renewing fuel target is provided by a rotating body arranged to transport fuel from a fuel reservoir to the plasma formation location.

19. A method according to clause 18, wherein the rotating body is a rotating disk.

20. A method according to claim 18 or 19, wherein the fuel reservoir is a bath of liquid fuel and the rotating body rotates through the bath of liquid fuel and the plasma formation location such that the rotating body receives a coating of liquid fuel and transports the coating of liquid fuel to the plasma formation location.

21. A method according to any one of clauses 16 to 20, wherein the continuous excitation beam is a continuous-wave laser beam provided by a continuous-wave laser.

22. A method according to clause 21, wherein the laser is arranged to generate the continuous-wave laser beam within an optical resonator comprising a first reflector and a second reflector.

23. A method according to clause 22, wherein the second reflector is provided by a surface of the continuously renewing fuel target at the plasma formation location.

24. A method according to any one of clauses 21 to 23, wherein the laser is a gas laser comprising at least one amplification chamber, wherein if the gas laser comprises a plurality of amplification chambers, each of the amplification chambers is maintained at substantially the same pressure.

25. A method according to any one of clauses 16 to 24, wherein radiation generated from the radiation generating plasma is collected by a radiation collector in the form of a grazing incidence collector or a normal incidence collector.

26. A method according to any one of clauses 16 to 25, wherein debris generated from the radiation generating plasma is mitigated by a rotating foil trap.

27. A lithographic method, comprising generating radiation according to the method of any one of clauses 16 to 25, and using the generated radiation to apply a pattern to a substrate.

28. A radiation source comprising a fuel target generator arranged to provide a continuously renewing fuel target at the plasma formation location, a fuel target generator arranged to provide a continuously renewing fuel target at the plasma formation location, an excitation beam source arranged to direct a continuous-wave excitation beam to the plasma formation location such that, in use, fuel within the continuously renewing fuel target is excited by the continuous-wave excitation beam to generate a radiation generating plasma.

29. A radiation source according to clause 28, wherein said fuel target generator comprises a nozzle for directing a jet from a first location to a second location, the jet being continuous between the first and second locations and comprising fuel for use in generating the radiation generating plasma, wherein the continuously renewing fuel target is a part of the jet at the plasma formation location.

30. A radiation source according to clause 28, wherein said fuel target generator comprises a body arranged to rotate to transport fuel from a fuel reservoir to the plasma formation location.

31. A radiation source according to clause 30, wherein said body is a disk.

32. A radiation source according to clause 30 or 31, wherein the fuel reservoir comprises a bath of liquid fuel, and said body is arranged to rotate through said bath of liquid fuel and the plasma formation location such that the body receives a coating of liquid fuel and transports the coating of liquid fuel to the plasma formation location.

33. A radiation source according to any one of clauses 28 to 32, wherein the excitation beam source comprises a continuous-wave laser arranged to provide the continuous excitation beam in the form of a continuous-wave laser beam.

34. A radiation source according to clause 33, wherein the continuous-wave laser is arranged to generate said continuous-wave laser beam within an optical resonator comprising a first reflector and a second reflector.

35. A radiation source according to clause 34, wherein the continuous-wave laser comprises the first reflector and is arranged to use a surface of said continuously-renewing fuel target at the plasma formation location as said second reflector.

36. A radiation source according to any one of clauses 28 to 35, further comprising a radiation collector for collecting radiation generated by said radiation generating plasma, wherein the radiation collector is a grazing incidence collector or a normal incidence collector.

37. A radiation source according to any one of clauses 28 to 36, further comprising debris mitigation means, the debris mitigation means comprising a rotating foil trap.

38. A lithographic apparatus comprising, or in connection with, the radiation source of any of clauses 28 to 37.

39. A lithographic apparatus of clause 38, further comprising an illumination system configured to condition the radiation generated by the radiation generating plasma to form a conditioned radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

40. A device manufacturing method comprising generating radiation using the method of any of clauses 16 to 27 and using the lithographic apparatus of clause 38 or 39 to pattern a substrate.

41. A method of generating radiation for a lithography apparatus, the method comprising providing a continuously renewing fuel target at a plasma formation location, and directing a continuous-wave excitation beam at the plasma formation location such that fuel within the continuously renewing fuel target is excited by the continuous-wave excitation beam to generate a radiation generating plasma.

42. The method of clause 41, wherein providing a continuously renewing fuel target comprises directing a jet from a first location to a second location, the jet being continuous between the first and second locations, the jet comprising a fuel for use in generating the radiation generating plasma, and the jet at least partially intersecting the plasma formation location.

43. The method of clause 41, wherein the continuously renewing fuel target is provided by a rotating body arranged to transport fuel from a fuel reservoir to the plasma formation location.

44. The method of clause 43, wherein the rotating body is a rotating disk.

45. The method of clause 43, wherein the fuel reservoir is a bath of liquid fuel and the rotating body rotates through the bath of liquid fuel and the plasma formation location such that the rotating body receives a coating of liquid fuel and transports the coating of liquid fuel to the plasma formation location.

46. The method of clause 41, wherein the continuous excitation beam is a continuous-wave laser beam provided by a continuous-wave laser.

47. The method of clause 46, wherein the laser is arranged to generate the continuous-wave laser beam within an optical resonator comprising a first reflector and a second reflector.

48. The method of clause 47, wherein the second reflector is provided by a surface of the continuously renewing fuel target at the plasma formation location.

49. The method of clause 48, wherein the laser is a gas laser comprising at least one amplification chamber, wherein if the gas laser comprises a plurality of amplification chambers, each of the amplification chambers is maintained at substantially the same pressure.

50. The method of clause 41, wherein radiation generated from the radiation generating plasma is collected by a radiation collector in the form of a grazing incidence collector or a normal incidence collector.

51. The method of clause 50, wherein debris generated from the radiation generating plasma is mitigated by a rotating foil trap.

52. A lithographic method, comprising providing a continuously renewing fuel target at a plasma formation location directing a continuous-wave excitation beam at the plasma formation location such that fuel within the continuously renewing fuel target is excited by the continuous-wave excitation beam to generate a radiation generating plasma, and using the generated radiation plasma to apply a pattern to a substrate.

53. A radiation source comprising a fuel target generator arranged to provide a continuously renewing fuel target at the plasma formation location, and an excitation beam source arranged to direct a continuous-wave excitation beam to the plasma formation location such that fuel within the continuously renewing fuel target is excited by the continuous-wave excitation beam to generate a radiation generating plasma.

54. The radiation source of clause 38, wherein said fuel target generator comprises a nozzle for directing a jet from a first location to a second location, the jet being continuous between the first and second locations and comprising fuel for use in generating the radiation generating plasma, wherein the continuously renewing fuel target is a part of the jet at the plasma formation location.

55. The radiation source of clause 53, wherein said fuel target generator comprises a body arranged to rotate to transport fuel from a fuel reservoir to the plasma formation location.

56. The radiation source of clause 55, wherein said body is a disk.

57. The radiation source of clause 55, wherein the fuel reservoir comprises a bath of liquid fuel, and said body is arranged to rotate through said bath of liquid fuel and the plasma formation location such that the body receives a coating of liquid fuel and transports the coating of liquid fuel to the plasma formation location.

58. The radiation source of clause 53, wherein the excitation beam source comprises a continuous-wave laser arranged to provide the continuous excitation beam in the form of a continuous-wave laser beam.

59. The radiation source of clause 58, wherein the continuous-wave laser is arranged to generate said continuous-wave laser beam within an optical resonator comprising a first reflector and a second reflector.

60. The radiation source of clause 59, wherein the continuous-wave laser comprises the first reflector and is arranged to use a surface of said continuously-renewing fuel target at the plasma formation location as said second reflector.

61. The radiation source of clause 53, further comprising a radiation collector for collecting radiation generated by said radiation generating plasma, wherein the radiation collector is a grazing incidence collector or a normal incidence collector.

62. The radiation source of clause 53, further comprising debris mitigation means, the debris mitigation means comprising a rotating foil trap.

63. A lithographic apparatus comprising a radiation source comprising a fuel target generator arranged to provide a continuously renewing fuel target at the plasma formation location, and an excitation beam source arranged to direct a continuous-wave excitation beam to the plasma formation location such that fuel within the continuously renewing fuel target is excited by the continuous-wave excitation beam to generate a radiation generating plasma, an illumination system configured to condition the radiation generated by the radiation generating plasma to form a conditioned radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

64. A device manufacturing method comprising generating radiation using the lithographic apparatus of clause 48 to pattern a substrate.

65. A radiation source, comprising a fuel target generator arranged to provide a fuel target at said target location, an excitation beam source arranged to direct a plurality of excitation beams at a target location to form a first merged excitation beam at the target location, such that, in use, fuel within the fuel target is excited by the first merged excitation beam to generate a radiation generating plasma, wherein said excitation beam source comprises at least one phase adjuster for adjusting a phase of at least one of said plurality of excitation beams with respect to at least one other of said plurality of excitation beams.

66. A radiation source according to clause 65, wherein said excitation beam source further comprises a first sensor arrangement configured to measure a first property, said first property being a property of a first portion of excitation radiation, said first property being indicative of a second property, said second property being a property of said first merged excitation beam, wherein said first property is at least partially determined by a phase of at least one of said plurality of excitation beams with respect to at least one other of said plurality of excitation beams.

67. A radiation source according to clause 66, wherein said first sensor arrangement comprises a first optical element arranged to direct respective portions of at least two of said plurality of excitation beams to form a second merged excitation beam, and wherein said first portion of excitation radiation is said second merged excitation beam.

68. A radiation source according to clause 66 or 67, wherein said first property is indicative of at least one of an intensity of said first merged excitation beam, a position of said first merged excitation beam, a focal point of said merged excitation beam, and an interference pattern of said merged excitation beam.

69. A radiation source according to any one of clauses 65 to 68, further comprising a controller, wherein the first sensor arrangement provides a first sensor signal to the controller, and wherein the controller is configured to control said at least one phase adjuster based at least in part on said first sensor signal.

70. A radiation source according to any one of clauses 65 to 69, further comprising a second sensor arrangement configured to measure a second property, said second property being a property of at least one second portion of excitation radiation, said second property being indicative of a third property, said third property being a property of at least one of said plurality of excitation beams.

71. A radiation source according to any one of clauses 65 to 70, wherein said second sensor arrangement is configured to measure a second property for each one of said plurality of excitation beams.

72. A radiation source according to any one of clauses 65 to 71, wherein said third property is a phase of said at least one of said plurality of excitation beams.

73. A radiation source according to any one of clauses 50 to 57, further comprising a second controller, wherein the second sensor arrangement provides a second sensor signal to the second controller, and wherein the second controller is configured to control said at least one phase adjuster based at least in part on said second sensor signal.

74. A radiation source according to any one of clauses 65 to 73, wherein said first sensor arrangement and/or second sensor arrangement comprises at least one of a photodiode, a split photodiode, a charge coupled device array and an active pixel sensor.

75. A radiation source according to any one of clauses 65 to 74, wherein said at least one phase adjuster comprises a respective phase adjuster for each of said plurality of excitation beams.

76. A radiation source according to any one of clauses 65 to 75, wherein said excitation beam source comprises at least one focusing element configured to direct said plurality of excitation beams to said plasma formation location, and wherein said at least one phase adjuster comprises means for varying a path length between a source of at least one of said plurality of excitation beams and said at least one focusing element.

77. A lithographic apparatus comprising, or in connection with, the radiation source of any of clauses 65 to 76.

78. A lithographic apparatus of clause 77, further comprising an illumination system configured to condition the radiation generated by the radiation generating plasma to form a conditioned radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

79. A method of generating radiation for a lithography apparatus, comprising providing a fuel target at a plasma formation location, directing a plurality of excitation beams at a plasma formation location to form a first merged excitation beam at the plasma formation location such that fuel within the fuel target is excited by the first merged excitation beam to generate a radiation generating plasma, adjusting a phase of at least one of said plurality of excitation beams with respect to at least one other of said plurality of excitation beams.

80. A method according to clause 79, wherein adjusting a phase of at least one of said plurality of excitation beams comprises adjusting a phase of at least one of said plurality of excitation beams such that each of said plurality of excitation beams is coherently merged in said first merged excitation beam.

81. A method according to clause 79 or 80, further comprising measuring at a first sensor arrangement a first property, said first property being a property of a first portion of excitation radiation, said first property being indicative of a second property, said second property being a property of said first merged excitation beam, wherein said first property is at least partially determined by a phase of at least one of said plurality of excitation beams with respect to at least one other of said plurality of excitation beams.

82. A method according to clause 81, further comprising directing respective portions of at least two of said plurality of excitation beams to form a second merged excitation beam, wherein said first portion of excitation radiation is said second merged excitation beam.

83. A method according to clause 82, wherein said first property is indicative of at least one of an intensity of said first merged excitation beam, a position of said first merged excitation beam, a focal point of said first merged excitation beam, and an interference pattern of said merged excitation beam.

84. A method according to any one of clauses 81 to 83, further comprising receiving a first sensor signal from the first sensor arrangement and adjusting said at least one phase adjuster based on said first sensor signal.

85. A method according to any one of clauses 64 to 69, further comprising measuring at a second sensor arrangement a third property, said third property being a property of at least one second portion of excitation radiation, said third property being indicative of a fourth property, said fourth property being a property of at least one of said plurality of excitation beams.

86. A method according to any one of clauses 79 to 85, wherein measuring at a second sensor arrangement comprises measuring a third property of a respective second portion of excitation radiation for each one of said plurality of excitation beams.

87. A method according to any one of clauses 79 to 86, wherein said third property is indicative of a phase of said at least one of said plurality of excitation beams.

88. A method according to any one of clauses 64 to 72, wherein adjusting a phase of at least one of said plurality of excitation beams with respect to at least one other of said plurality of excitation comprises adjusting a phase of a respective phase adjuster for each of said plurality of excitation beams.

89. A method according to any one of clauses 64 to 73, wherein adjusting a phase of at least one of said plurality of excitation beams with respect to at least one other of said plurality of excitation beams comprises varying a path length between a source of at least one of said plurality of excitation beams and at least one focusing element arranged to direct said plurality of excitation beams to said plasma formation location.

90. A lithographic method, comprising generating radiation according to the method of any of claims 79 to 89, and using the generated radiation to apply a pattern to a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

When describing the lithographic apparatus, the term "lens," where the context allow, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

What is claimed is:

1. A radiation source configured for use in a lithographic apparatus, the radiation source comprising:
   a fuel target generator arranged to provide a continuously renewing fuel target at a plasma formation location;
   an excitation beam source arranged to direct a continuous-wave excitation beam to the plasma formation location such that, in use, fuel within the continuously renewing fuel target is excited by the continuous-wave excitation beam to generate a radiation generating plasma; and
   a sensor configured to receive a portion of the continuous-wave excitation beam and determine a position of the plasma formation location,
   wherein said fuel target generator comprises a nozzle for directing a liquid jet from a first location to a second location, the liquid jet being continuous between the first and second locations and comprising fuel for use in generating the radiation generating plasma, wherein the continuous liquid jet at least partially intersects the plasma formation location.

2. A radiation source configured for use in a lithographic apparatus, the radiation source comprising:
   a fuel target generator arranged to provide a continuously renewing fuel target at a plasma formation location; and
   an excitation beam source arranged to direct a continuous-wave excitation beam to the plasma formation location such that, in use, fuel within the continuously renewing fuel target is excited by the continuous-wave excitation beam to generate a radiation generating plasma,
   wherein said fuel target generator comprises a body arranged to rotate to transport fuel from a fuel reservoir to the plasma formation location such that there is fuel on the rotating body at the plasma formation location.

3. The radiation source according to claim 2, wherein the excitation beam source comprises a continuous-wave laser and wherein the laser is arranged to generate the continuous-wave laser beam within an optical resonator comprising a first reflector and a second reflector.

4. The radiation source according to claim 1, wherein the excitation beam source comprises a continuous-wave laser arranged to provide the continuous-wave excitation beam in the form of a continuous-wave laser beam and wherein the continuous-wave laser is arranged to generate said continuous-wave laser beam within an optical resonator comprising a first reflector and a second reflector.

5. A radiation source, comprising:
   a fuel target generator arranged to provide a fuel target at a target location; and
   an excitation beam source arranged to split a received seed beam into a plurality of excitation beams and to direct the plurality of excitation beams at the target location to form a first merged excitation beam at the target location, such that, in use, fuel within the fuel target is excited by the first merged excitation beam to generate a radiation generating plasma, wherein the excitation beam source comprises at least one phase adjuster for adjusting a phase of at least one of the plurality of excitation beams with respect to at least one other of the plurality of excitation beams, and wherein each of the plurality of excitation beams has a same wavelength.

6. The radiation source according to claim 5, wherein:
the excitation beam source further comprises a first sensor arrangement configured to measure a first property, the first property being a property of a first portion of excitation radiation, the first property being indicative of a second property, the second property being a property of the first merged excitation beam, and
wherein the first property is at least partially determined by a phase of at least one of the plurality of excitation beams with respect to at least one other of the plurality of excitation beams.

7. The radiation source according to claim 6, wherein the first sensor arrangement comprises a first optical element arranged to direct respective portions of at least two of the plurality of excitation beams to form a second merged excitation beam, and wherein the first portion of excitation radiation is the second merged excitation beam.

8. A method of generating radiation for a lithography apparatus, comprising:
providing a fuel target at a plasma formation location;
splitting a received seed beam into a plurality of excitation beams;
directing the plurality of excitation beams at the plasma formation location to form a first merged excitation beam at the plasma formation location such that fuel within the fuel target is excited by the first merged excitation beam to generate a radiation generating plasma; and
adjusting a phase of at least one of the plurality of excitation beams with respect to at least one other of the plurality of excitation beams, wherein each of the plurality of excitation beams has a same wavelength.

9. The method according to claim 8, wherein adjusting a phase of at least one of the plurality of excitation beams comprises adjusting a phase of at least one of the plurality of excitation beams such that each of the plurality of excitation beams is coherently merged in the first merged excitation beam.

10. The method according to claim 8, further comprising:
measuring at a first sensor arrangement a first property, the first property being a property of a first portion of excitation radiation, the first property being indicative of a second property, the second property being a property of said first merged excitation beam,
wherein the first property is at least partially determined by a phase of at least one of the plurality of excitation beams with respect to at least one other of the plurality of excitation beams.

11. The radiation source according to claim 2, wherein the rotating body is a rotating disk.

12. The radiation source according to claim 2, wherein the body is configured to provide the continuously renewing fuel target around an edge of the body at the plasma formation location.

13. The radiation source according to claim 2, wherein the fuel reservoir is a bath of liquid fuel and the rotating body rotates through the bath of liquid fuel and the plasma formation location such that the rotating body receives a coating of liquid fuel and transports the coating of liquid fuel to the plasma formation location.

14. The radiation source according to claim 1, wherein debris generated from the radiation generating plasma is mitigated by a rotating foil trap.

15. The radiation source according to claim 3, wherein:
the laser is a gas laser comprising at least one amplification chamber, and
the gas laser comprises a plurality of amplification chambers, wherein each of the amplification chambers is maintained at a substantially same pressure.

* * * * *

UNITED STATES PATENT AND TRADEMARK OFFICE
CERTIFICATE OF CORRECTION

| | |
|---|---|
| PATENT NO. | : 9,986,628 B2 |
| APPLICATION NO. | : 14/440934 |
| DATED | : May 29, 2018 |
| INVENTOR(S) | : Loopstra et al. |

It is certified that error appears in the above-identified patent and that said Letters Patent is hereby corrected as shown below:

On the Title Page

Item (57) Abstract, please replace "to a radiation generating plasma" with --to generate a radiation generating plasma--

Signed and Sealed this
Eighteenth Day of December, 2018

Andrei Iancu
*Director of the United States Patent and Trademark Office*